United States Patent
Katayama

(10) Patent No.: US 9,576,632 B2
(45) Date of Patent: Feb. 21, 2017

(54) MAGNETIC STORAGE DEVICE

(71) Applicant: Akira Katayama, Seoul (KR)

(72) Inventor: Akira Katayama, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/844,218

(22) Filed: Sep. 3, 2015

(65) Prior Publication Data

US 2016/0260466 A1 Sep. 8, 2016

Related U.S. Application Data

(60) Provisional application No. 62/127,563, filed on Mar. 3, 2015.

(51) Int. Cl.
*G11C 11/16* (2006.01)

(52) U.S. Cl.
CPC .......... *G11C 11/161* (2013.01); *G11C 11/1673* (2013.01); *G11C 11/1675* (2013.01)

(58) Field of Classification Search
None
See application file for complete search history.

(56) References Cited

U.S. PATENT DOCUMENTS

| | | | |
|---|---|---|---|
| 6,809,976 B2 * | 10/2004 | Ooishi | G11C 11/16 365/158 |
| 2007/0097730 A1 * | 5/2007 | Chen | G11C 11/16 365/158 |
| 2009/0201717 A1 | 8/2009 | Maeda et al. | |
| 2016/0099406 A1 * | 4/2016 | Nishiyama et al. | H01L 43/10 257/421 |
| 2016/0163370 A1 * | 6/2016 | Miyata et al. | G11C 11/1675 365/94 |

FOREIGN PATENT DOCUMENTS

JP 2009301668 A 12/2009
JP 2010211884 A 9/2010

* cited by examiner

*Primary Examiner* — James G Norman
(74) *Attorney, Agent, or Firm* — Holtz, Holtz & Volek PC

(57) ABSTRACT

A magnetic storage device of one embodiment includes a first and second magnetoresistive effect elements. The first magnetoresistive element includes a first magnetic layer having a first coercivity, a second magnetic layer having a second coercivity higher than the first coercivity, and a third magnetic layer having a third coercivity higher than the second coercivity. Magnetization orientations of the second and third magnetic layers are antiparallel. The second magnetoresistive effect element includes a fourth magnetic layer having a fourth coercivity, a fifth magnetic layer having a fifth coercivity higher than the fourth coercivity, and a sixth magnetic layer having a sixth coercivity higher than the fifth coercivity. Magnetization orientations of the fifth and sixth magnetic layers are parallel.

20 Claims, 15 Drawing Sheets

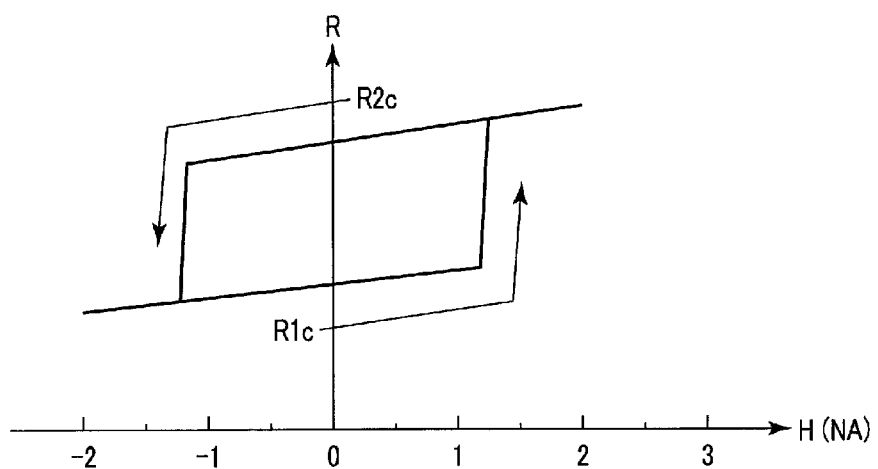
F I G. 3
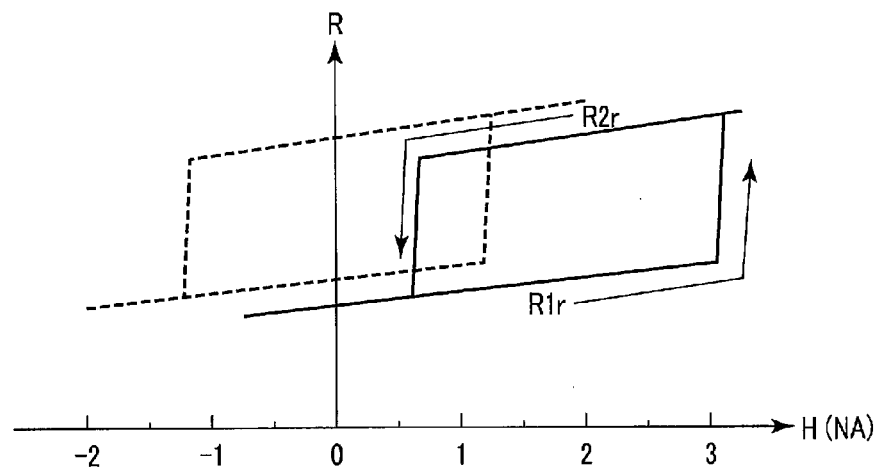
F I G. 4

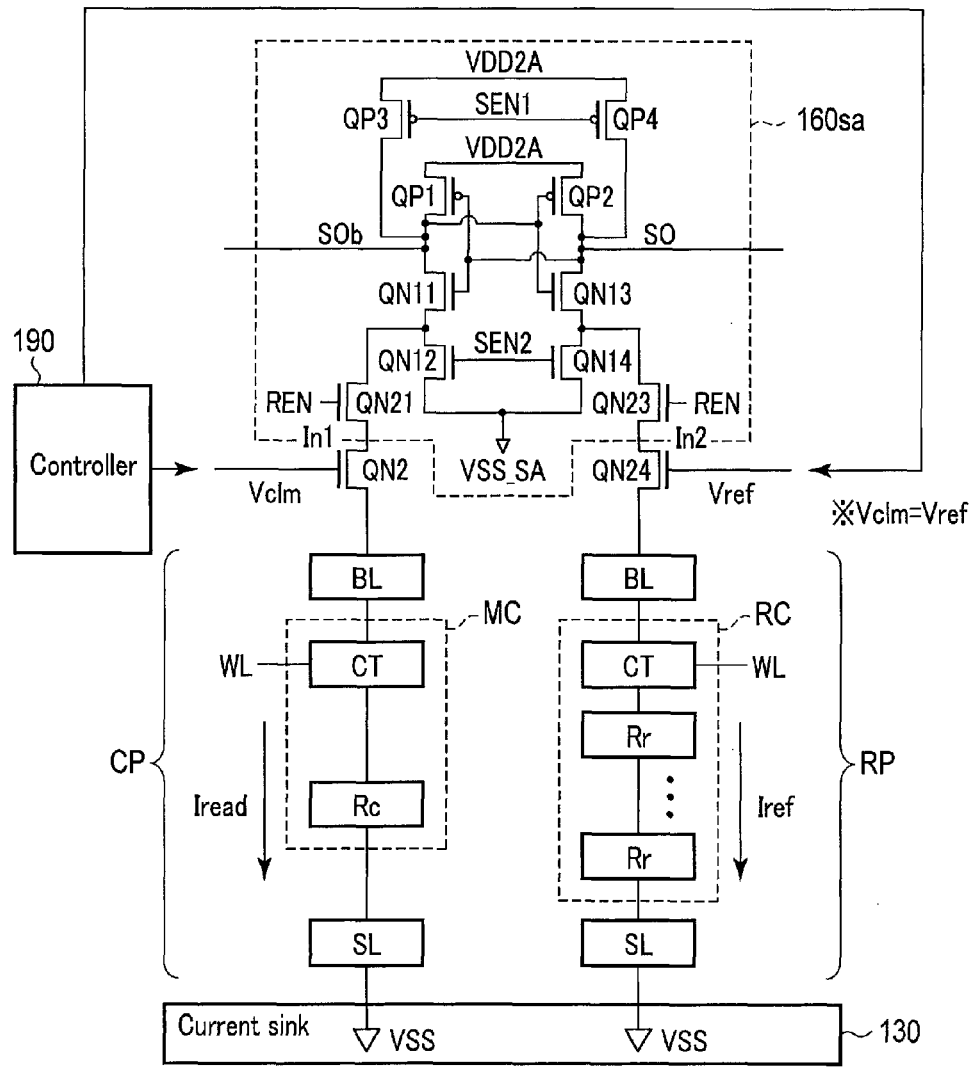
F I G. 8

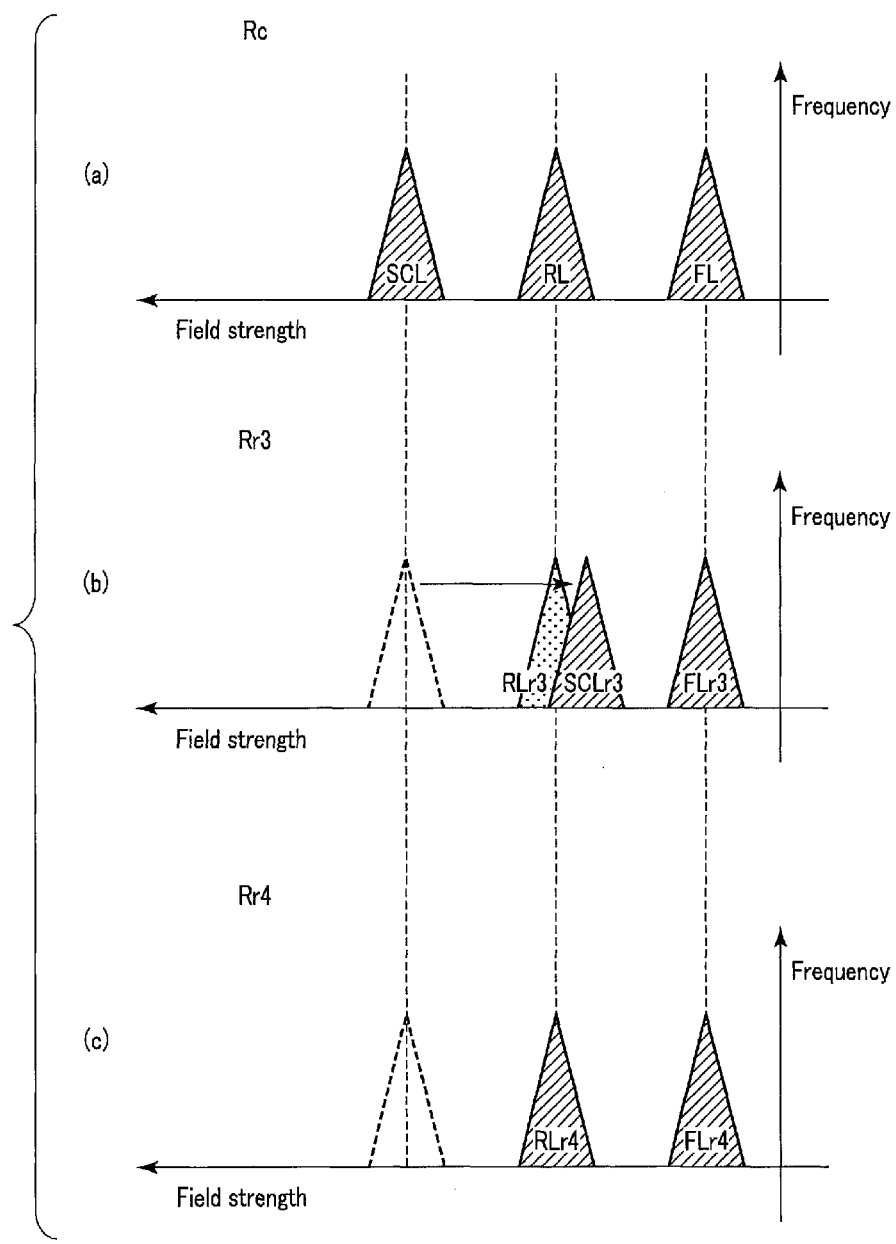
F I G. 10

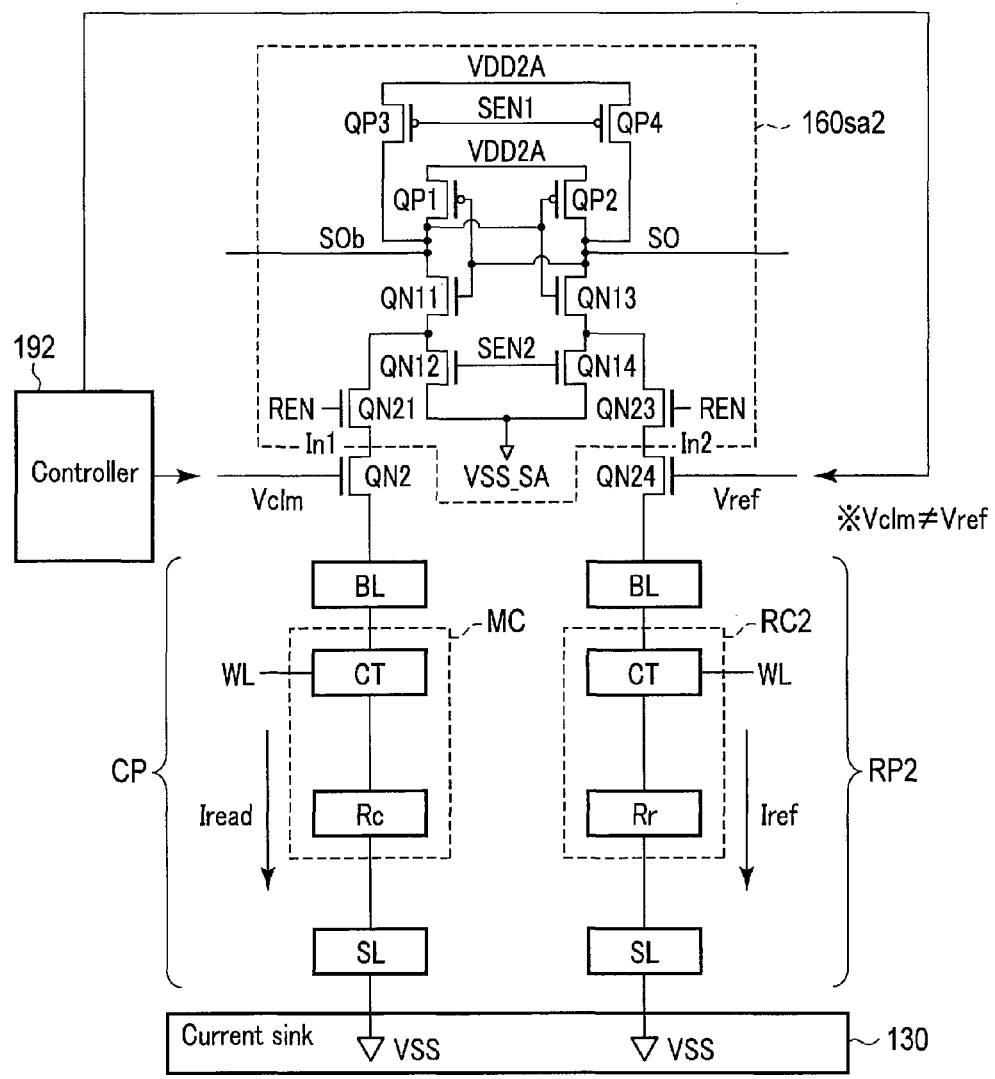
F I G. 11

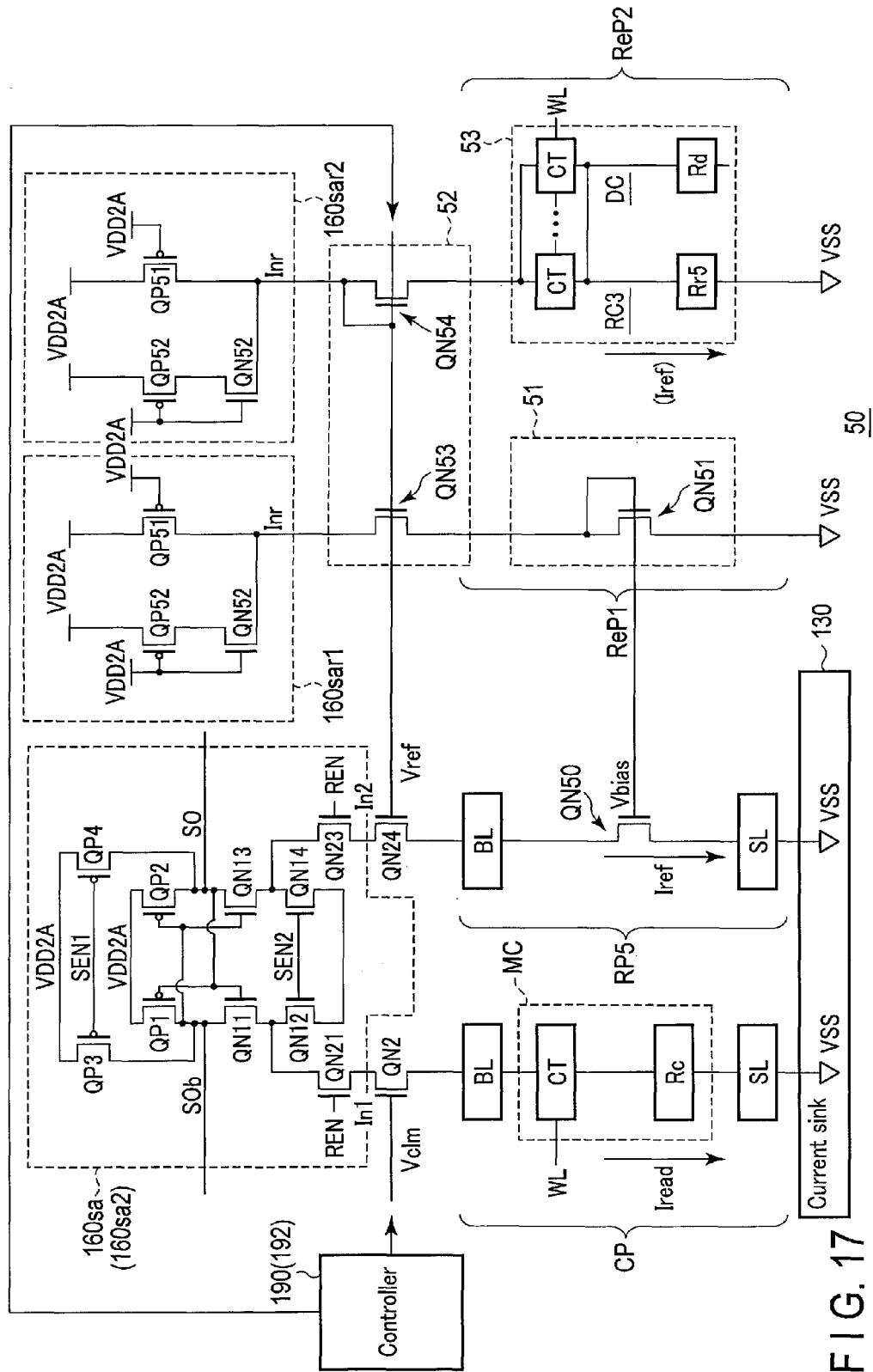
F I G. 17

MAGNETIC STORAGE DEVICE

CROSS-REFERENCE TO RELATED APPLICATIONS

This application claims the benefit of U.S. Provisional Application No. 62/127,563, filed Mar. 3, 2015, the entire contents of which are incorporated herein by reference.

FIELD

Embodiments described herein relate generally to a magnetic storage device.

BACKGROUND

As a storage device, a magnetic storage device using a magnetoresistive effect element is known, for example.

BRIEF DESCRIPTION OF THE DRAWINGS

FIG. 3 shows a hysteresis characteristic of the magnetoresistive effect element of the magnetic storage device according to the first embodiment;

FIG. 4 shows another hysteresis characteristic of the magnetoresistive effect element of the magnetic storage device according to the first embodiment;

FIG. 8 schematically shows a circuit on a read path of the magnetic storage device according to the first embodiment;

FIG. 10 schematically shows distributions of magnetization switching thresholds in layers of the magnetoresistive effect elements of the magnetic storage device according to the modification of the first embodiment;

FIG. 11 schematically shows a circuit on a read path of a magnetic storage device according to a second embodiment;

FIG. 17 schematically shows a circuit on a read path of a magnetic storage device according to a fifth embodiment.

DETAILED DESCRIPTION

Figure 1:
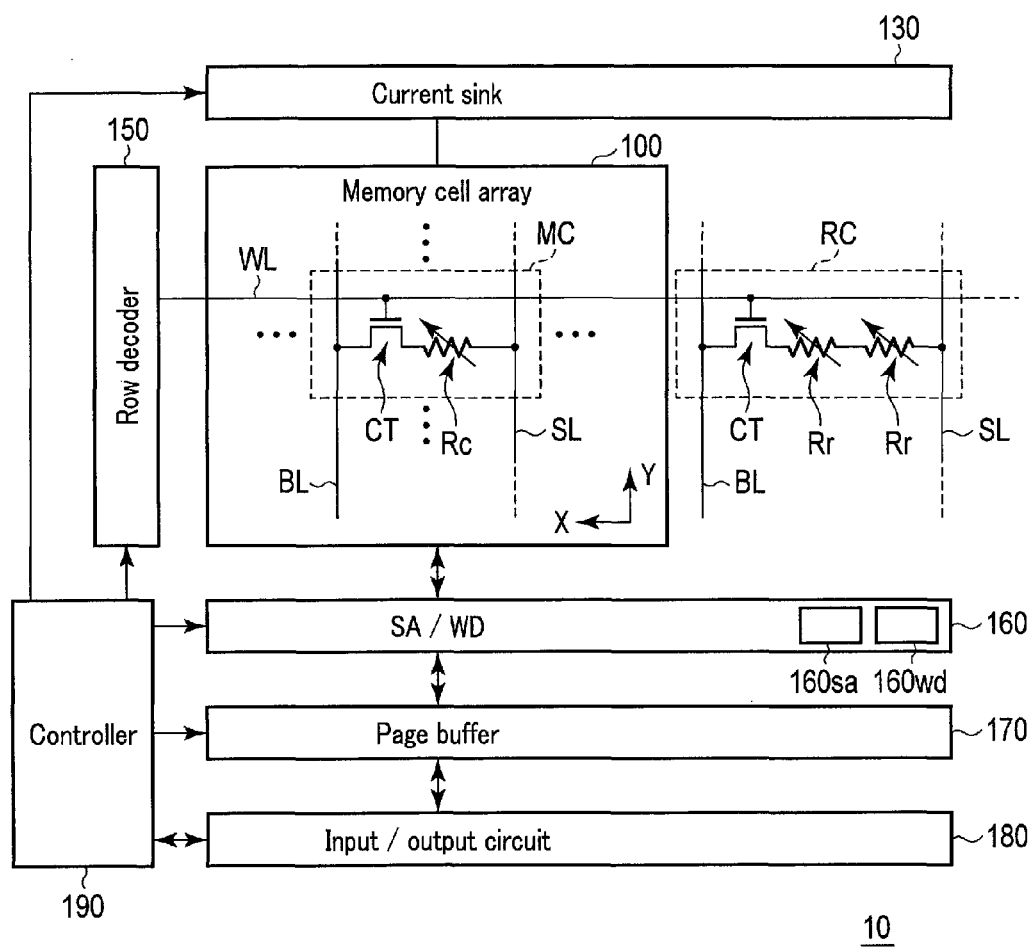
FIG. 1 shows an example of the circuit configuration of a magnetic storage device according to a first embodiment.

A magnetic storage device includes plural memory cells and plural reference cells. A memory cell includes, e.g., a magnetoresistive effect element, and can store data. A reference cell includes, e.g., a resistor, and is used to generate a reference current. The reference current is referred to when reading of data from the memory cell. To increase the data read accuracy, the type of resistor used in the reference cell is important.

A magnetic storage device of one embodiment includes a first magnetoresistive effect element, a second magnetoresistive element, and an amplifier. The first magnetoresistive effect element includes a first magnetic layer having a first coercivity, a second magnetic layer having a second coercivity higher than the first coercivity, and a third magnetic layer having a third coercivity higher than the second coercivity. A magnetization orientation of the second magnetic layer is antiparallel to a magnetization orientation of the third magnetic layer. The second magnetoresistive effect element includes a fourth magnetic layer having a fourth coercivity, a fifth magnetic layer having a fifth coercivity higher than the fourth coercivity, and a sixth magnetic layer having a sixth coercivity higher than the fifth coercivity. A magnetization orientation of the fifth magnetic layer is parallel to a magnetization orientation of the sixth magnetic layer. The amplifier has a first input coupled to the first magnetoresistive effect element and a second input coupled to the second magnetoresistive effect element, and amplifies a difference between a potential of the first input and a potential of the second input.

The embodiments will be described below with reference to the accompanying drawings. In these drawings, the same reference numerals denote the same components. Also, a repetitive explanation will be made as needed.

First Embodiment

A storage device according to the present embodiment will be described below. An example of the storage device according to the present embodiment is an Spin-Transfer Torque (STT) Magnetoresistive Random Access Memory (MRAM) as a magnetic storage device using a Magnetic Tunnel Junction (MTJ) element which is a magnetoresistive effect element as a storage element.

(1) Configuration Example of Magnetic Storage Device

A configuration example of an MRAM 10 as the storage device according to the present embodiment will be described with reference to FIG. 1. FIG. 1 shows an example of the circuit configuration of the magnetic storage device according to the present embodiment.

As shown in FIG. 1, the MRAM 10 includes a memory cell array 100, a current sink 130, a row decoder 150, a sense amplifier and write driver (SA/WD) 160, a page buffer 170, an input/output circuit 180, and a controller 190. The MRAM 10 includes at least one memory cell array 100.

The memory cell array 100 includes plural memory cells MC. The memory cells MC are arranged in a matrix in the memory cell array 100. The memory cells MC arranged in each row in the X direction (row direction) are coupled to a common word line WL among plural word lines WL extending in the X direction in the memory cell array 100. Plural memory cells MC arranged in each column in the Y direction (column direction) are coupled to a common pair of a bit line BL and a source line SL among plural pairs of bit line BL and source line SL extending in the Y direction in the memory cell array 100.

The memory cell MC includes, e.g., an MTJ element Rc as a first magnetoresistive effect element, and a cell transistor CT as a first cell switch. The MTJ element Rc can be switched between a low-resistance state as a first state and a high-resistance state as a second state. The MTJ element Rc is configured to be able to store data by the change in resistance state. The MTJ element Rc is so configured that data is written or read when various kinds of electric currents are supplied. The cell transistor CT is coupled in series with the MTJ element Rc, and configured to control the supply and stop of a current to the MTJ element Rc. Current supply is started by turning on the cell transistor CT, and stopped by turning off the cell transistor CT.

In the memory cell MC, one end of the MTJ element Rc is coupled to one of the pair of a bit line BL and a source line SL, e.g., the source line SL. The memory cell MC is coupled to the other of the pair of bit line BL and source line SL, e.g., the bit line BL, at one end of the current path of the cell transistor CT. The memory cell MC is coupled to a word line WL at the gate of the cell transistor CT.

Plural reference cells RC are arranged near the memory cell array 100. Each reference cell RC includes, e.g., at least two MTJ elements Rr, i.e., an MTJ element Rr as a second magnetoresistive effect element and an MTJ element Rr as a third magnetoresistive effect element, and a cell transistor CT as a second cell switch. The MTJ element Rr is fixed to, e.g., the low-resistance state. Plural MTJ elements Rr are arranged in series so as to exhibit a resistance value between the resistance value of the high-resistance MTJ element Rc and the resistance value of the low-resistance MTJ element Rc, e.g., a central value of these two values. Alternatively, plural MTJ elements Rr may also be coupled in parallel and exhibit a resistance value between the resistance value of the high-resistance MTJ element Rc and the resistance value of the low-resistance MTJ element Rc. The MTJ elements Rr are used to generate a reference current to be referred to when reading data from the memory cell MC. The cell transistor CT is coupled in series with the MTJ elements Rr. The cell transistor CT is so configured as to control the supply and stop of a current to the MTJ elements Rr.

The reference cell RC is coupled to, e.g., the source line SL at one terminal of the MTJ element Rr arranged in the endmost portion. The reference cell RC is coupled to, e.g., the bit line BL, at one end of the current path of the cell transistor CT. The reference cell RC is coupled to the word line WL at the gate of the cell transistor CT. The word line WL may also be shared by another memory cell MC. The reference cell RC may also be referred to when reading data from the memory cell MC coupled to a common word line WL.

The SA/WD 160 is coupled to the bit lines BL and source lines SL. The SA/WD 160 supplies a current to a memory cell MC as an operation target, and performs write and read to the memory cell MC (MTJ element Rc), via a bit line BL and a source line SL. More specifically, a write driver 160*wd* of the SA/WD 160 performs a write to the memory cell MC.

A sense amplifier 160*sa* of the SA/WD 160 performs a read from the memory cell MC. The write driver 160*wd* and sense amplifier 160*sa* are provided for each pair of the bit line BL and source line SL.

The current sink 130 is coupled to one end of each bit line BL and one end of each source line SL. In operations such as a data write and read, the current sink 130 sets the bit line BL or source line SL at a ground potential.

The row decoder 150 is arranged on one or both sides of the memory cell array 100 in the X direction, and coupled to the word lines WL. The row decoder 150 decodes the row address of a command address signal. Also, the row decoder 150 is configured to apply a voltage to the word line WL coupled to the memory cell MC as an operation target, in operations such as a data write and read, in accordance with the row address.

The page buffer 170 temporarily stores data to be written in the memory cell array 100, and data read from the memory cell array 100, by a data unit called a "page".

The input/output circuit 180 transmits various externally received signals to the controller 190 and page buffer 170, and transmits various kinds of information outside from the controller 190 and page buffer 170.

The controller 190 is coupled to the current sink 130, row decoder 150, SA/WD 160, page buffer 170, and input/output circuit 180. The controller 190 controls the current sink 130, row decoder 150, SA/WD 160, and page buffer 170 in accordance with external signals received by the input/output circuit 180.

(2) Configuration Examples of Magnetoresistive Effect Elements

Configuration examples of the MTJ elements Rc and Rr will be described with reference to FIGS. 2 to 6.

[First Magnetoresistive Effect Element]

Figure 2:
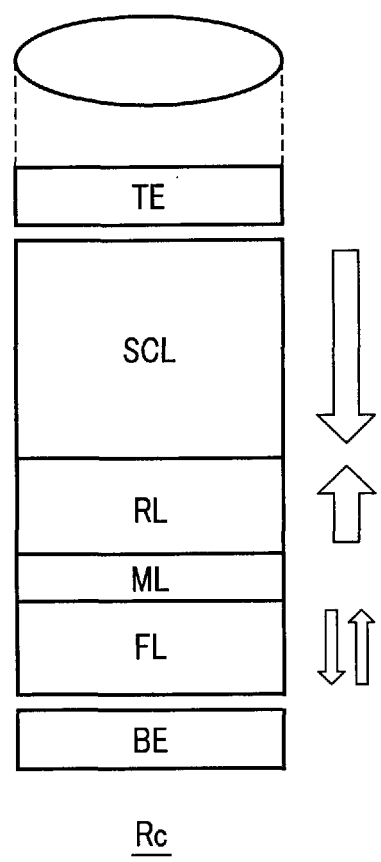
FIG. 2 schematically shows a configuration example of a magnetoresistive effect element of the magnetic storage device according to the first embodiment.

FIG. 2 schematically shows a configuration example of the magnetoresistive effect element of the magnetic storage device according to the present embodiment.

The MTJ element Rc shown in FIG. 2 functions as a storage element capable of storing data. The MTJ element Rc is configured to take different resistance states in accordance with the direction of a current flowing through the MTJ element Rc. A phenomenon in which the resistance changes in accordance with the state is referred to as a magnetoresistive effect. The MTJ element Rc uses the magnetoresistive effect to store data.

As shown in FIG. 2, the MTJ element Rc includes at least a free layer FL as a first magnetic layer provided on a bottom electrode BE, a reference layer RL as a second magnetic layer provided on the free layer FL, and a shift control layer SCL as a third magnetic layer provided on the reference layer RL. The reference layer RL is thicker than the free layer FL, and the shift control layer SCL is thicker than the reference layer RL. The thickness of each of the layers FL, RL, and SCL is the width of each of the layers FL, RL, and SCL in the stacking direction. A top electrode TE is provided on the shift control layer SCL. The MTJ element Rc includes a middle layer ML as a nonmagnetic layer between the free layer FL and reference layer RL. The free layer FL, middle layer ML, and reference layer RL make a magnetic tunnel junction (MTJ). The MTJ element Rc has, e.g., a circular shape when viewed from above. That is, each of the layers from the bottom electrode BE to the top electrode TE is formed into a circular shape when viewed from above. The shape of the MTJ element Rc when viewed from above is, however, not limited to a circle.

The free layer FL, reference layer RL, and shift control layer SCL are magnetic layers having magnetic anisotropy.

Each of the free layer FL, reference layer RL, and shift control layer SCL has magnetic anisotropy in a direction intersecting the layer surface. The layer surface is a surface with which a layer faces another layer. The direction intersecting the layer surface is a direction perpendicular to or nearly perpendicular to the layer surface. That is, the MTJ element Rc is formed as, e.g., a perpendicularly magnetized MTJ element having perpendicular magnetic anisotropy.

The free layer FL has a magnetic orientation toward one of the bottom electrode BE and reference layer RL, and the magnetization orientation is easily switched. The reference layer RL has a magnetization orientation toward, e.g., the shift control layer SCL. The shift control layer SCL has a magnetization orientation toward, e.g., the reference layer RL. That is, the shift control layer SCL has a magnetization orientation which is antiparallel to that of the reference layer RL. The magnetization orientations of the reference layer RL and shift control layer SCL are not easily switched and are normally fixed. The shift control layer SCL cancels a leakage magnetic field of the reference layer RL to prevent the leakage magnetic field of the reference layer RL from fixing the magnetization orientation of the free layer FL in a direction parallel to the magnetization orientation of the reference layer RL.

The coercivity of each of the layers FL, RL, and SCL determines the ease with which the magnetization orientation of each of the layers FL, RL, and SCL is switched. The coercivity is a characteristic of holding magnetism. As the coercivity increases, the magnetism becomes easy to hold, and the magnetization orientation becomes difficult to switch. The free layer FL has a first coercivity. The reference layer RL has a second coercivity larger than the first coercivity. The shift control layer SCL has a third coercivity larger than the second coercivity. That is, of the layers FL, RL, and SCL, the free layer FL has the smallest coercivities the magnetization orientation is most easily switched. The reference layer RL and shift control layer SCL have the coercivities larger than that of the free layer FL, so the magnetization orientations are difficult to switch.

The ease with which the magnetization orientation of each of the layers FL, RL, and SCL is switched can also be described by the magnetization switching threshold of each of the layers FL, RL, and SCL. The magnetization switching threshold of each of the free layer FL and reference layer RL is a current value at which the magnetization orientation switches in each of the layers FL and RL when a current flowing through the MTJ element Rc is supplied in a direction in which the magnetization orientation of each of the layers FL and RL switches. The magnetization orientation of each of the layers FL and RL does not switch when the current value is smaller than the magnetization switching threshold, and switches when the current value is equal to or larger than the magnetization switching threshold. Of the layers FL, RL, and SCL, the free layer FL has the smallest magnetization switching threshold, so the magnetization orientation easily switches with a small current value. The shift control layer SCL has the largest magnetization switching threshold, and this threshold is adjusted to, e.g., a value at which the magnetization orientation does not switch even when a current is supplied to the shift control layer SCL. To switch the magnetization orientation of the shift control layer SCL requires, e.g., application of a strong magnetic field to the shift control layer SCL as will be described later. The reference layer RL has a magnetization switching threshold between those of the free layer FL and shift control layer SCL.

Thus, the magnetization orientation of the free layer FL is maintained or switched in accordance with the direction of a write current supplied when writing data. The write current is larger than the magnetization switching threshold of the free layer FL. For example, when the write current is supplied from the free layer FL to the reference layer RL, the magnetization orientations in the free layer FL and reference layer RL become parallel to each other. In contrast, when the write current is supplied from the reference layer RL to the free layer FL, the magnetization orientations in the free layer FL and reference layer RL become antiparallel to each other.

The MTJ element Rc exhibits different resistance states in accordance with the relative relationship between the magnetization orientations in the reference layer RL and free layer FL. More specifically, the MTJ element Rc is configured to store data "1" or "0" in accordance with whether the magnetization orientations in the reference layer RL and free layer FL are in the parallel state (low-resistance state) or the antiparallel state (high-resistance state). Either the parallel state (low-resistance state) or the antiparallel state (high-resistance state) can be set as data "1" or "0". Data "1" and "0" are distinguished from each other by comparing a read current flowing through the MTJ element Rc with a reference current flowing through the reference cell RC.

[Hysteresis Characteristics of Magnetoresistive Effect Elements]

The MTJ element Rr has a structure similar to that of the MTJ element Rc, and functions as a storage element to be used as the reference cell RC. However, while the magnetization orientation of the free layer FL can be parallel or antiparallel to that in the reference layer RL in the MTJ element Rc, the MTJ element Rr is so configured that the magnetization orientation of the free layer is readily maintained parallel to that in the reference layer. This point will be described below with reference to FIGS. 3 and 4.

FIGS. 3 and 4 each show the hysteresis characteristic of the magnetoresistive effect element of the magnetic storage device according to the present embodiment. FIG. 3 shows an example of the MTJ element Rc, and FIG. 4 shows an example of the MTJ element Rr.

As shown in FIGS. 3 and 4, the hysteresis characteristics of the MTJ elements Rc and Rr are represented by hysteresis curves including first paths R1 (R1$c$ and R1$r$) and second paths r2 (R2$c$ and R2$r$). In the first paths R1, the MTJ elements Rc and Rr change from the low resistance to the high resistance as the magnitude of a magnetic field to be applied to the MTJ elements Rc and Rc changes. That is, the magnetization orientation of the free layer becomes antiparallel to that in the reference layer in each of the MTJ elements Rc and Rr. In the second paths R2, the MTJ elements Rc and Rr change from the high resistance to the low resistance as the magnitude of a magnetic field to be applied to the MTJ elements Rc and Rr in a direction opposite to that described above changes. That is, the magnetization orientation of the free layer becomes parallel to that in the reference layer in each of the MTJ elements Rc and Rr. In FIGS. 3 and 4, plus (+H) indicates the magnetic field which changes the MTJ elements Rc and Rr from the low resistance to the high resistance. Also, in FIGS. 3 and 4, minus (−H) indicates the magnetic field which changes the resistance value (R) of each of the MTJ elements Rc and Rr from the high resistance to the low resistance.

As shown in FIG. 3, the magnitude of a magnetic field when the MTJ element Rc switches from the low resistance to the high resistance is about +1.2, and the magnitude of a magnetic field when the MTJ element Rc switches from the high resistance to the low resistance is about −1.2, i.e., the absolute values are equal. The magnitude of a magnetic field at the switching point indicates the coercivity of the free layer FL in the resistance state (magnetization orientation) at that time. That is, the coercivity of the free layer FL in the low-resistance state (parallel state) is about +1.2 (NA: arbitrary unit), and the coercivity of the free layer FL in the high-resistance state is about −1.2 (NA). This demonstrates that in the MTJ element Rc, the magnetization switching threshold which sets the magnetization orientation of the free layer FL in the parallel state is equal to that which sets the magnetization orientation of the antiparallel state. That is, in the MTJ element Rc, the ease with which the magnetization orientation of the free layer FL switches to the parallel state is equal to that with which the magnetization orientation switches to the antiparallel state.

In FIG. 3 as described above, the distance of the first path R1c from the origin and that of the second path R2c from the origin are equal on the X-axis. This means that the ease with which magnetization is maintained in the first path R1c is equal to that with which magnetization is maintained in the second path R2c. "Hysteresis" is a phenomenon in which when a magnetic field to be applied to a magnetic layer such as the free layer FL is changed, the change in magnetization lags behind the change in magnetic field, i.e., a hysteresis phenomenon. Accordingly, the hysteresis characteristic increases as the ease with which magnetization of a magnetic layer is maintained increases, and decreases as the ease with which magnetization of a magnetic layer changes increases. That is, the hysteresis characteristic of the first path R1c is equal to that of the second path R2c in the MTJ element Rc. In addition, since the distances of the first and second paths R1c and R2c from the origin are equal, the central point of the hysteresis curve overlaps a point at which the magnitude of a magnetic field is zero (H=0). That is, the hysteresis curve shown in FIG. 3 is symmetrical with respect to the Y-axis. Since the central point of the hysteresis curve thus overlaps the point at which the magnitude of a magnetic field is zero, both the first and second paths R1c and R2c have intersection points on the Y-axis. In the MTJ element Rc, therefore, there is particularly no direction in which the magnetization orientation of the free layer FL is easily maintained with respect to the magnetization orientation of the reference layer RL, so both the high-resistance state and low-resistance state can be taken in a state in which no magnetic field is applied.

In contrast, the MTJ element Rr has the hysteresis characteristic that the ease with which the magnetization orientation of the free layer is switched is biased toward "parallel" rather than "antiparallel".

As shown in FIG. 4, the absolute value of the magnitude of a magnetic field when the MTJ element Rr switches from the low resistance to the high resistance is larger than that of the magnitude of a magnetic field when the MTJ element Rr switches from the high resistance to the low resistance. That is, the coercivity of the free layer in the low-resistance state (parallel state) is about +3.0 (NA), and that of the free layer in the high-resistance state (antiparallel state) is about +0.5 (NA). This reveals that in the MTJ element Rr, the magnetization switching threshold which sets the magnetization orientation of the free layer in the parallel state is smaller than that which sets the magnetization orientation of the free layer in the antiparallel state. That is, in the MTJ element Rr, the switching of the magnetization orientation of the free layer to the parallel state occurs more easily than that to the antiparallel state.

In FIG. 4 as described above, the first path R1r is shifted to the direction away from the point at which the magnitude of a magnetic field is zero, i.e., the direction in which the plus of a magnetic field increases, when compared to FIG. 3. Also, the second path R2r is shifted to the direction toward the point at which the magnitude of a magnetic field is zero, i.e., the direction in which the minus of a magnetic field decreases and switches to plus. This means that the hysteresis characteristic (the ease with which magnetization is maintained) of the first path R1r is larger than that of the second path R2r. In addition, since the distances of the first and second paths R1r and R2r from the origin are different, the central point of the hysteresis curve is also shifted from the point at which the magnitude of a magnetic field is zero to the plus direction of the magnetic field, i.e., the direction in which the low resistance is maintained. That is, the hysteresis curve shown in FIG. 4 is asymmetrical with respect to the Y-axis. Since the central point of the hysteresis curve is thus shifted from the point at which the magnitude of a magnetic field is zero, only a portion of the low-resistance state (parallel state) of the second path R2r is an intersection point on the Y-axis. In the MTJ element Rr, therefore, the magnetization orientation of the free layer is easily maintained parallel to that of the reference layer, and takes the low-resistance state while no magnetic field is applied.

Note that the above-described MTJ element Rc sometimes has a slight individual difference in hysteresis characteristic. That is, the MTJ element Rc may unintentionally have a hysteresis curve which is not perfectly symmetrical with respect to the Y-axis. Accordingly, the coercivity, magnetization switching threshold, and the like of the free layer FL in the parallel state are not perfectly equal to those in the antiparallel state. In the MTJ element Rr, however, the asymmetry of the hysteresis curve with respect to the Y-axis and the shifts of the coercivity, magnetization switching threshold, and the like of the free layer are intentionally designed, and have differences exceeding the individual difference of the MTJ element Rr.

The MTJ element Rr having the hysteresis characteristic as described above is, e.g., configured as follows. In the MTJ element Rr, the coercivity of the shift control layer is significantly increased, and the magnetization orientation of the shift control layer is parallel to that in the reference layer. Consequently, the magnetization orientation of the free layer is placed under the influence of a leakage magnetic field of the reference layer, and easily maintained parallel to the magnetization orientation of the reference layer. Examples of a specific configuration which implements the MTJ element Rr having the characteristic as described above will be described below.

[Second & Third Magnetoresistive Effect Elements]

Figure 5:
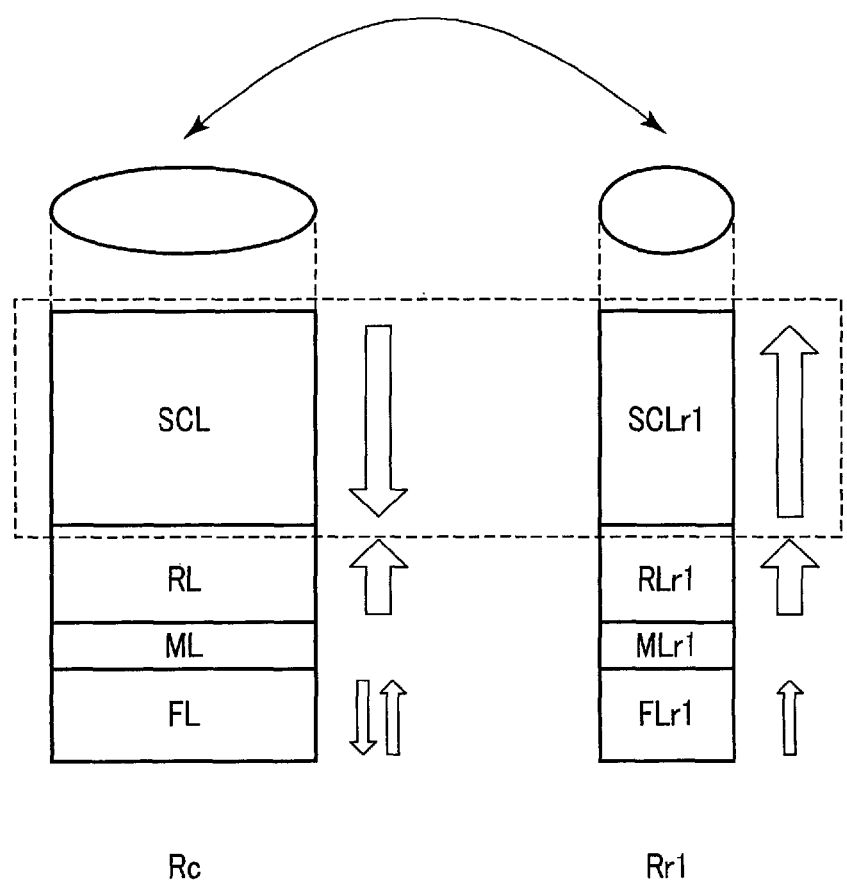
FIG. 5 schematically shows configuration examples of the magnetoresistive effect elements of the magnetic storage device according to the first embodiment.
Figure 6:
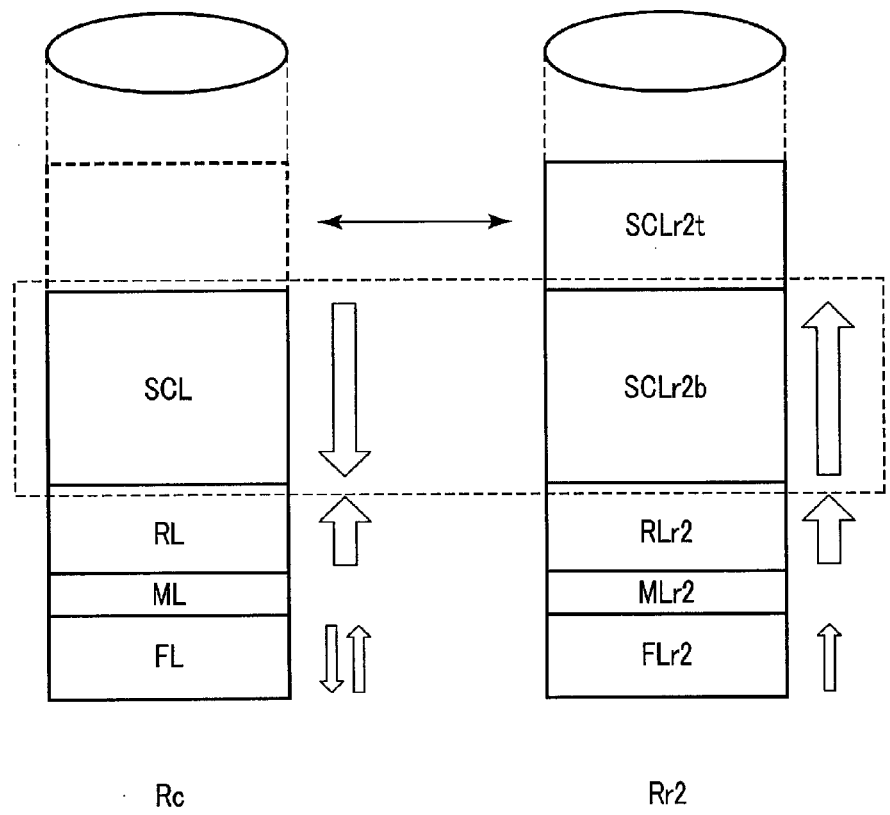
FIG. 6 schematically shows other configuration examples of the magnetoresistive effect elements of the magnetic storage device according to the first embodiment.

FIGS. 5 and 6 schematically show configuration examples of the magnetoresistive effect element of the magnetic storage device according to the present embodiment. FIGS. 5 and 6 show the MTJ element Rc on the left-hand side and the MTJ element Rr on the right-hand side by contrast with each other. FIGS. 5 and 6 do not show the top electrode TE and bottom electrode BE.

As shown in FIG. 5, the MTJ element Rr1 includes a free layer FLr1 as a first magnetic layer, a reference layer RLr1 as a second magnetic layer provided on the free layer FLr1, and a shift control layer SCLr1 as a third magnetic layer provided on the reference layer RLr1. The reference layer RLr1 is thicker than the free layer FLr1, and the shift control layer SCLr1 is thicker than the reference layer RLr1. The MTJ element Rr1 includes a middle layer MLr1 between the free layer FLr1 and reference layer RLr1. The MTJ element Rr1 has a circular shape smaller than that of the MTJ element Rc when, e.g., viewed from above. However, the shape of the MTJ element Rr1 when viewed from above is not limited to a circular shape, and at least the area of the layer surface of the shift control layer SCLr1 need only be smaller than that of the layer surface of the shift control layer SCL of the MTJ element Rc.

The free layer FLr1 has a magnetization orientation toward, e.g., the reference layer RLr1. The magnetization orientation of the free layer FLr1 is under the influence of a leakage magnetic field of the reference layer RLr1, and fixed parallel to the magnetization orientation of the reference layer RLr1. The reference layer RLr1 has a magnetization orientation toward, e.g., the shift control layer SCLr1. The shift control layer SCLr1 has a magnetization orientation toward, e.g., the side (the side of the top electrode TE (not shown)) opposite to the reference layer RLr1. That is, the shift control layer SCLr1 has a magnetization orientation parallel to that of the reference layer RLr1. Accordingly, the leakage magnetic field of the reference layer RLr1 is not canceled but strengthened, so the magnetization orientation of the free layer FLr1 is easily fixed parallel to that in the reference layer RLr1.

The layers FLr1, RLr1, and SCLr1 respectively have a first coercivity (which changes its magnitude in accordance with whether the state is parallel or antiparallel), a second coercivity larger than the first coercivity, and a third coercivity larger than the second coercivity, in the MTJ element Rr1 as well. In the MTJ element Rr1, however, these differences are larger than those in the MTJ element Rc. Since the MTJ element Rr1 has, e.g., a circular shape smaller than that of the MTJ element Rc, the magnetic flux densities in the layers FLr1, RLr1, and SCLr1 are higher than those of the MTJ element Rc. Accordingly, the coercivities of the layers FLr1, RLr1, and SCLr1 increase in accordance with the respective thicknesses of these layers. This makes it possible to significantly increase, e.g., the coercivity of particularly the shift control layer SCLr1 as described above.

FIG. 6 shows another configuration example of the MTJ element Rr.

As shown in FIG. 6, the MTJ element Rr2 includes a free layer FLr2 as a first magnetic layer, a reference layer RLr2 as a second magnetic layer provided on the free layer FLr2, and a shift control layer SCLr2 as a third magnetic layer provided on the reference layer RLr2. The shift control layer SCLr2 includes a shift control layer SCLr2b, and a shift control layer SCLr2t provided on the shift control layer SCLr2b. The reference layer RLr2 is thicker than the free layer FLr2. The shift control layer SCLr2 is thicker than the reference layer RLr2, and thicker than the shift control layer SCL of the MTJ element Rc. Such a shift control layer SCLr2 is obtained by, e.g., forming the shift control layer SCLr2b together with the shift control layer SCL of the MTJ element Rc, and additionally stacking the shift control layer SCLr2t. The MTJ element Rr2 includes a middle layer MLr2 between the free layer FLr2 and reference layer RLr2. The MTJ element Rr2 has a circular shape having the same size as that of the circular shape of the MTJ element Rc when, e.g., viewed from above.

The free layer FLr2 has the magnetization orientation toward, e.g., the reference layer RLr2. The magnetization orientation of the free layer FLr2 is under the influence of a leakage magnetic field of the reference layer RLr2, and fixed parallel to the magnetization orientation of the reference layer RLr2. The reference layer RLr2 has the magnetization orientation toward, e.g., the shift control layer SCLr2. The shift control layer SCLr2 has the magnetization orientation parallel to that in the reference layer RLr2. This facilitates fixing the magnetization orientation of the free layer FLr2 parallel to that of the reference layer RLr2.

The layers FLr2, RLr2, and SCLr2 respectively have a first coercivity (which changes its magnitude in accordance with whether the state is parallel or antiparallel), a second coercivity larger than the first coercivity, and a third coercivity larger than the second coercivity, in the MTJ element Rr2 shown in FIG. 6 as well. Since the shift control layer SCLr2 of the MTJ element Rr2 is thicker than, e.g., the shift control layer SCL of the MTJ element Rc, the magnetization vector of the shift control layer SCLr2 is larger than that of the shift control layer SCL. This makes it possible to significantly increase, e.g., the coercivity of the shift control layer SCLr2 as described above.

Note that it is also possible to apply both the configurations shown in FIGS. 5 and 6 to the MTJ element Rr. That is, the MTJ element Rr may also have a circular shape smaller than that of the MTJ element Rc when viewed from above, and have the shift control layer SCLr thicker than the shift control layer SCL of the MTJ element Rc. This further increases the coercivity of the shift control layer SCLr. Alternatively, the MTJ elements Rr1 and rr2 may also coexist in one MRAM 10.

In each of the MTJ elements Rr in FIGS. 5 and 6, the free layer FLr of the layers FLr, RLr, and SCLr has the smallest magnetization switching threshold. However, the value in the parallel state differs from that in the antiparallel state. The shift control layer SCLr has the largest magnetization switching threshold, and the reference layer RLr has a magnetization switching threshold between those of the free layer FLr and shift control layer SCLr.

From the foregoing, in the MTJ element Rr, the magnetization orientation of the free layer FLr stabilizes in the same direction as the magnetization orientations in the reference layer RLr and shift control layer SCLr, regardless of an attempt to set a direction of the magnetization orientation of the free layer FLr. That is, the MTJ element Rr stabilizes in the low-resistance state. This is because when the reference layer RLr and shift control layer SCLr have the same magnetization orientation as described above, a magnetic field significantly stronger than that of the free layer FLr is generated, so the magnetization orientation of the free layer FLr can take only the state parallel to the magnetization orientations in the reference layer RLr and shift control layer SCLr. Accordingly, even when performing write by using a write current supplied for writing the MTJ element Rc to make the magnetization orientation of the free layer FLr antiparallel to the layers RLr and SCLr, the magnetization orientation of the free layer FLr stabilizes parallel to the layers RLr and SCLr. This phenomenon by which the magnetization orientation of the free layer FLr is fixed in the parallel state is also called P_Stuck.

The reference cell RC is so configured as to have a resistance value between the low-resistance MTJ element Rc and high-resistance MTJ element Rc. The reference cell RC including the low-resistance (P_Stucked) MTJ element Rr is also called a P_Stuck cell.

(3) Method of Manufacturing Magnetoresistive Effect Elements

For example, the MTJ elements Rc and Rr as described above are manufactured as follows.

First, the layers FL, FLr, RL, RLr, SCL, and SCLr are stacked. After that, magnetic fields corresponding to the coercivities of the layers FL, FLr, RL, RLr, SCL, and SCLr are applied to them in different directions as needed. Consequently, the layers FL, FLr, RL, RLr, SCL, and SCLr are set in desired magnetization orientations.

Figure 7:
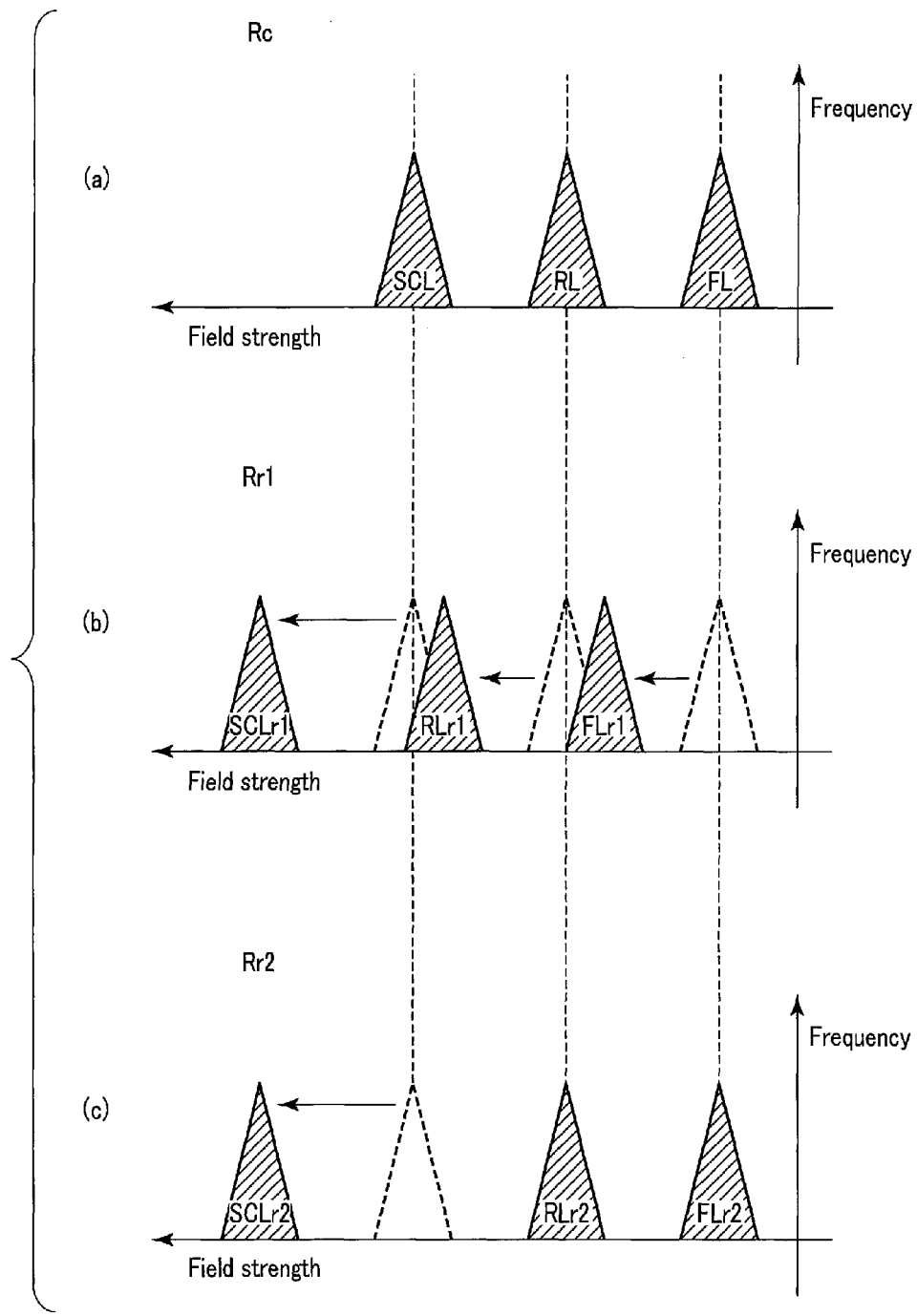
FIG. 7 schematically shows distributions of magnetization switching thresholds in layers of the magnetoresistive effect elements of the magnetic storage device according to the first embodiment.

FIG. 7 schematically shows the distributions of magnetization switching thresholds in the individual layers of the magnetoresistive effect element of the magnetic storage device according to the present embodiment. Referring to FIG. 7, the magnetization switching threshold is defined as a magnetic field strength which switches the magnetization orientation in each layer of the magnetoresistive effect element when a magnetic field is applied through the magnetoresistive effect element in a direction which switches the magnetization orientation of each layer. The abscissa of FIG. 7 indicates the magnetic field strength. The ordinate of FIG. 7 indicates the existence probability (frequency) of each layer having a specific magnetization switching threshold. (a) of FIG. 7 shows an example of the MTJ element Rc. (b) of FIG. 7 shows an example of the MTJ element Rr1. (c) of FIG. 7 shows an example of the MTJ element Rr2.

As shown in (a) of FIG. 7, the magnetization switching thresholds of the layers FL, RL, and SCL of the MTJ element Rc are respectively proportional to, e.g., the coercivities of the layers FL, RL, and SCL. When setting the magnetization orientations of the layers FL, RL, and SCL, magnetic fields are applied to the MTJ element Rc in descending order of the magnetic field strength.

First, the strongest magnetic field is applied to the MTJ element Rc in accordance with the shift control layer SCL having the highest coercivity. As a consequence, all the layers FL, RL, and SCL are once set in the same magnetization orientation.

Then, a magnetic field weaker than that is applied to the MTJ element Rc, thereby setting the magnetization orientation of the reference layer RL. When setting the magnetization orientation of the reference layer RL, a magnetic field in a direction opposite to that of the magnetic field applied for the shift control layer SCL is applied. This makes the magnetization orientation of the reference layer RL opposite to that of the shift control layer SCL. The applied magnetic field is strong enough to switch the free layer FL, but is not strong enough to switch the shift control layer SCL. Therefore, the magnetization orientation of the free layer FL is the same as that of the reference layer RL, and the magnetization orientation of the shift control layer SCL is maintained in the above-mentioned direction.

Subsequently, the weakest magnetic field is applied to the MTJ element Rc, thereby setting the magnetization orientation of the free layer FL. When setting the magnetization orientation of the free layer FL, a magnetic field in the same direction as that of the magnetic field applied for the shift control layer SCL is applied. This makes the magnetization orientation of the free layer FL opposite to that of the reference layer RL. Since the applied magnetic field is not strong enough to switch the reference layer RL, the magnetization orientation of the reference layer RL is maintained in the above-mentioned direction.

By the above-described method, the MTJ element Rc in which the layers FL, RL, and SCL have the magnetization orientations shown in FIG. 2 is obtained. Thus, the MTJ element Rc is manufactured as an MTJ element Rc having, e.g., the high resistance in the initial state. However, the MTJ element Rc may also be so configured as to have the low resistance in the initial state. In this case, the step of setting the magnetization orientation of the free layer FL by applying the weakest magnetic field is unnecessary.

As shown in (b) of FIG. 7, the magnetization switching thresholds of the layers FLr1, RLr1, and SCLr1 of the MTJ element Rr1 are also proportional to the coercivities of the layers FLr1, RLr1, and SCLr1. The magnetization switching thresholds of the layers FLr1, RLr1, and SCLr1 of the MTJ element Rr1 are respectively larger than those of the layers FL, RL, and SCL of the MTJ element Rc. In particular, the increase in magnetization switching threshold of the shift control layer SCLr1 is notable.

In the MTJ element Rr1, all the layers FLr1, RLr1, and SCLr1 have the same magnetization orientation, so the magnetization orientations of all the layers FLr1, RLr1, and SCLr1 can be set by applying the strongest magnetic field once.

That is, the strongest magnetic field is applied in accordance with the shift control layer SCLr1, thereby setting the magnetization orientation of the shift control layer SCLr1. Consequently, the magnetization orientations of the layers FLr1 and RLr1 can be set in the same direction as that of the shift control layer SCLr1.

By the above-described method, the MTJ element Rr1 in which the layers FLr1, RLr1, and SCLr1 have the magnetization orientations shown in FIG. 5 is obtained. Thus, the MTJ element Rr1 is manufactured as a P_Stucked MTJ element Rr1.

As shown in (c) of FIG. 7, the magnetization switching thresholds of the layers FLr2, RLr2, and SCLr2 of the MTJ element Rr2 are also proportional to the coercivities of the layers FLr2, RLr2, and SCLr2. The magnetization switching thresholds of the layers FLr2 and RLr2 are respectively equal to, e.g., those of the layers FL and RL of the MTJ element Rc. The magnetization switching threshold of the shift control layer SCLr2 thickened by stacking two layers is larger than, e.g., that of the shift control layer SCL of the MTJ element Rc.

The magnetization orientations of all the layers FLr2, RLr2, and SCLr2 are set in the same direction by applying a magnetic field once. As a consequence, the MTJ element Rr2 in which the layers FLr2, RLr2, and SCLr2 have the magnetization orientations shown in FIG. 6 is obtained. Thus, the MTJ element Rr2 is manufactured as a P_Stucked MTJ element Rr2.

The magnetization orientations in the MTJ elements Rc and Rr1 may also be set in parallel. The magnetization orientations in the MTJ elements Rc and Rr2 may also be set in parallel. When the MTJ element Rr1 and Rr2 coexist in one MRAM 10, the magnetization orientations in two or more of the MTJ elements Rc, Rr1, and Rr2 may also be set in parallel. When the magnetization orientations are set in parallel for any of the MTJ elements Rc, Rr1, and Rr2, the magnetization orientations of layers having the same magnetization switching threshold and the same magnetization orientation may also be set at once by applying a magnetic field once. That is, the magnetization orientations of the shift control layers SCLr1 and SCLr2 may also be set at once by applying a magnetic field once. The magnetization orientations of the reference layers RL and RLr2 may also be set at once by applying a magnetic field once. The magnetization orientations of the free layers FL, FLr1, and FLr2 may also be set at once by applying a magnetic field once. In layers having the same magnetization switching threshold and different magnetization orientations, such as the shift control layer SCL and reference layer RLr1, it is necessary to block magnetic fields to be applied to the MTJ elements Rc and Rr1 so that a magnetic field applied to one of the MTJ elements should not exert influence on the other.

(4) Operation Example of Magnetic Storage Device

An operation example of the MRAM 10 will be described with reference to FIG. 8. FIG. 8 schematically shows circuits on the read path of the magnetic storage device according to the present embodiment.

As shown in FIG. 8, the read path of the MRAM 10 includes the sense amplifier 160sa, a read current path CP, a reference current path RP, and the current sink 130.

The sense amplifier 160sa includes an input node In1 as a first input node, and an input node In2 as a second input node, and outputs signals SO and SOb based on the difference between the input values of the input nodes In1 and In2. b at the end of the signal SOb indicates the inverted logic of this element. In the following description, a transistor QPn is a p-type MOSFET or the like, and a transistor QNm is an n-type MOSFET or the like. However, the types of the transistors QPn and QNm can be switched.

Transistors QP1, QN11, and QN12 are coupled in series between a power node VDD2A and ground node VSS_SA. Also, transistors QP2, QN13, and QN14 are coupled in series between the power node VDD2A and ground node VSS_SA.

The connection node of the transistors QP1 and QN11 is an output node SOb, and outputs the signal SOb. The output node SOb is coupled to the gates of the transistors QP2 and QP13. The connection node of the transistors QP2 and QN13 is an output node SO, and outputs the signal SO. The output node SO is coupled to the gates of the transistors QP1 and QN11. The gate of the transistor QN12 is coupled to the gate of the transistor QN14 (SEN2).

The output nodes SOb and SO are coupled to the power node VDD2A via transistors QP3 and QP4, respectively. The gate of the transistor QP3 is coupled to the gate of the transistor QP4 (SEN1).

The connection node of the transistors Q11 and Q12 is coupled to one terminal of a transistor QN21. The other terminal of the transistor QN21 makes the input node In1 of the sense amplifier 160sa. The connection node of the transistors Q13 and Q14 is coupled to one terminal of a transistor QN23. The other terminal of the transistor QN23 makes the input node In2 of the sense amplifier 160sa. The sense amplifier 160sa is enabled when a High-level signal REN is supplied to the gates of the transistors QN21 and QN23.

The input node In1 is coupled to one terminal of a transistor QN2. The other terminal of the transistor QN2 is coupled to the bit line BL on the memory cell MC side. The gate of the transistor QN2 receives a potential Vclm as a first potential. The transistor QN2 and potential Vclm clamp the voltage of the other terminal of the transistor QN2 at a particular value. The controller 190 supplies the potential Vclm from, e.g., a voltage generator (not shown).

The input node In2 is coupled to a transistor QN24. The other terminal of the transistor QN24 is coupled to the bit line BL on the reference cell RC side. The gate of the transistor QN24 receives a potential Vref as a second potential. The transistor QN24 and potential Vref clamp the voltage of the other terminal of the transistor QN24 at a particular value. The controller 190 controls the potential Vref such that it becomes equal to, e.g., the potential Vclm, and supplies the potential Vref from, e.g., a voltage generator (not shown).

The read current path CP includes the memory cell MC, and is formed between the input node In1 of the sense amplifier 160sa and the ground node VSS of the current sink 130.

When reading out data, the word line WL coupled to the memory cell MC as a read target (to be also referred to as a selected memory cell MC hereinafter) is made high, and the cell transistor CT in the memory cell MC is turned on. Accordingly, the selected memory cell MC is coupled between the bit line BL and source line SL. As a result, the read current path CP including the selected memory cell MC is formed between the input node In1 and ground node VSS. Consequently, a read current Iread corresponding to the resistance state of the selected memory cell MC flows through the read current path CP.

The reference current path RP includes the reference cell RC associated with the above-mentioned memory cell MC, and is formed between the input node In2 of the sense amplifier 160sa, and the ground node VSS of the current sink 130.

When reading out data, the word line WL coupled to the reference cell RC is made high, and the cell transistor CT in the reference cell RC is turned on. Accordingly, the reference cell RC is coupled between the bit line BL and source line SL. As a result, the reference current path RP including the reference cell RC is formed between the input node In2 and ground node VSS. Consequently, a reference current Iref corresponding to the resistance value of the reference cell RC flows through the reference current path RP. The resistance value of the reference cell RC is adjusted with a plurality of MTJ elements Rr in the reference cell RC. Therefore, the reference current Iref is, e.g., a current intermediate between the read current Iread when the above-mentioned memory cell MC holds data "1", and the read current Iread when the memory cell MC holds data "0".

The read current Iread having flowed through the read current path CP is detected at the input node In1 as an input value to the sense amplifier 160sa. The reference current Iref having flowed through the reference current path RP is detected at the input node In2 as an input value to the sense amplifier 160sa. The sense amplifier 160sa compares the read current Iread with the reference current Iref. Based on whether the read current Iread is larger or smaller than the reference current Iref, the sense amplifier 160sa outputs corresponding signals SO and SOb. That is, the resistance state of the memory cell MC is determined, and data stored in the memory cell MC is read out. Note that the input values at the input nodes In1 and In2 may also be voltages, potentials, or the like.

(5) Effects of this Embodiment

This embodiment achieves one or a plurality of effects below.

(A) The present embodiment includes the MTJ element Rc capable of storing data, and the MTJ element Rr which is referred to when reading out the data. In the present embodiment, therefore, both the memory cell MC and reference cell RC include MTJ elements.

In an MRAM of a comparative example, a resistor of a diffusion layer, for example, is used as a resistor of a reference cell. However, the diffusion resistor is larger than the MTJ element used in the memory cell, and hence increases the installation area. Also, the diffusion resistor has a temperature characteristic different from that of the MTJ element. Therefore, a change in environment temperature may make it impossible to correctly compare the read current with the reference current. To suppress this, it is necessary to adjust the potentials to be applied to the two input nodes of the sense amplifier, and this complicates the circuit design and read operation.

In the present embodiment, the MTJ elements are used in both the memory cell MC and reference cell RC. Accordingly, it is possible to downsize the reference cell RC and reduce the installation area. As another aspect, the temperature characteristics of the memory cell MC and reference cell RC are equal, so the change in characteristic of the memory cell MC caused by a temperature change is canceled by the change in characteristic of the reference cell RC caused by the temperature change. It is also unnecessary to perform potential adjustment for the temperature change, between the input nodes In1 and In2 of the sense amplifier 160sa. This implements the MRAM 10 having a small dependence on temperature.

(B) In the present embodiment, the MTJ element Rr is easily maintained in the low-resistance state rather than the high-resistance state. This generates the reference current Iref more stably.

In the MRAM of the comparative example, if, for example, the MTJ element used in the memory cell is directly applied to the reference cell, it is sometimes impossible to obtain a sufficient stability in the resistance state of the reference cell. This is so because the resistance state of the reference cell may flip, with time, for example.

In the present embodiment, the MTJ element Rr of the reference cell RC is so adjusted that the magnetization orientation of the free layer FL is easily maintained parallel to the magnetization orientation of the reference layer RL, by changing, e.g., the size or layer configuration. This makes it possible to prevent flip of the resistance state of the reference cell RC, and obtain a stable reference current Iref.

(C) In the present embodiment, the area of the layer surface of the shift control layer SCLr1 of the MTJ element Rr1 is smaller than that of the layer surface of the shift control layer SCL of the MTJ element Rc.

(D) In the present embodiment, the shift control layer SCLr2 of the MTJ element Rr2 is thicker than the shift control layer SCL of the MTJ element Rc.

With configuration (C) or (D) described above, the coercivity of the shift control layer SCLr of the MTJ element Rr is larger than that of the shift control layer SCL of the MTJ element Rc. When the magnetization orientation of the shift control layer SCLr thus configured is made parallel to that in the reference layer RLr, the magnetization orientation of the free layer FLr is easily maintained parallel to that in the reference layer RLr.

With configuration (C) or (D) described above, it is possible to manufacture the MTJ elements Rc and Rr by substantially the same process, and prevent an increase in number of steps and the complexity of the process.

(E) In the present embodiment, the MTJ element Rc is coupled to the input node In1 of the sense amplifier 160sa, and a plurality of MTJ elements Rr are coupled to the input node In2. The plurality of P_Stucked MTJ elements Rr control the reference current Iref at a current value as the reference for the read current Iread. This eliminates the need for potential adjustment between the input nodes In1 and In2.

(6) Modification According to Present Embodiment

Figure 9:
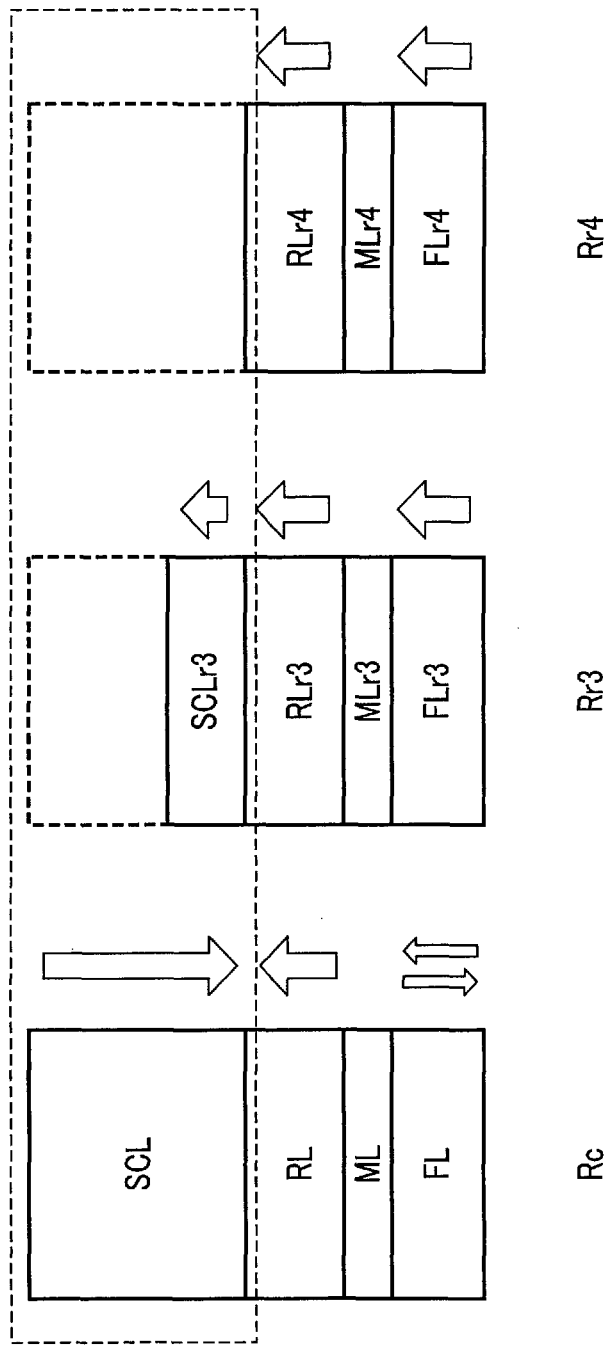
FIG. 9 schematically shows configuration examples of magnetoresistive effect elements of a magnetic storage device according to a modification of the first embodiment.

Modifications according to the present embodiment will be described with reference to FIG. 9. FIG. 9 schematically shows a configuration example of a magnetoresistive effect element of a magnetic storage device according to the modifications of the present embodiment. FIG. 9 shows the MTJ element Rc in the left-hand side part and MTJ elements Rr3 and Rr4 on the right-hand side part for contrasting. FIG. 9 does not show the top electrode TE and bottom electrode BE.

In the above-described embodiment, the MTJ element Rr is so configured that the coercivity of the shift control layer SCLr increases in the MTJ element Rr. In the modifications, the MTJ element Rr is so configured that the coercivity of the shift control layer SCLr as a third coercivity weakens in the MTJ element Rr.

As shown in FIG. 9, the shift control layer SCLr need only be thinned, for example, in order to weaken the coercivity of the shift control layer SCLr.

[Modification 1]

In the MTJ element Rr3, the thickness of a shift control layer SCLr3 is, e.g., less than that of a reference layer RLr3. This makes the coercivity of the shift control layer SCLr3 smaller than the coercivity (a second coercivity) of the reference layer RLr3. Accordingly, a leakage magnetic field of the reference layer RLr3 is not canceled, so the magnetization orientation is placed under the influence of the leakage magnetic field of the reference layer RLr3. Therefore, the magnetization orientation of a free layer FLr3 is fixed parallel to that of the reference layer RLr3.

In this case, if the magnetization orientation of the shift control layer SCLr3 is parallel to that of the reference layer RLr3, the magnetization orientation of the free layer FLr3 is fixed more easily. However, the magnetization orientation of the shift control layer SCLr3 may also be antiparallel to that of the reference layer RLr3. This is so because the influence which the shift control layer SCLr3 has on the magnetization orientation of the free layer FLr3 is much smaller than that which the reference layer RLr3 has on the magnetization orientation of the free layer FLr3.

Note that when the magnetization orientation of the shift control layer SCLr3 is parallel to that of the reference layer RLr3, the thickness of the shift control layer SCLr3 need only be, e.g., less than that of the shift control layer SCL of the MTJ element Rc. In this case, the influence the leakage magnetic field of the reference layer RLr3 has on the free layer FLr3 in the MTJ element Rr3 becomes larger than that in at least the MTJ element Rc. This makes it possible to place the magnetization orientation of the free layer FLr3 under the influence of the leakage magnetic field of the reference layer RLr3. Accordingly, the magnetization orientation of the free layer FLr3 is fixed parallel to that of the reference layer RLr3.

Other layers of the MTJ element Rr3, i.e., the free layer FLr3, a middle layer MLr3, and the reference layer RLr3 are formed like the corresponding layers FL, ML, and RL of the MTJ element Rc.

[Modification 2]

In the MTJ element Rr4, the thickness of a shift control layer is zero nm. Consequently, the influence the leakage magnetic field of a reference layer RLr4 has on a free layer FLr4 becomes maximum. Therefore, the magnetization orientation of the free layer FLr4 is fixed parallel to that of the reference layer RLr4 in this case as well.

Other layers of the MTJ element Rr4, i.e., the free layer FLr4, a middle layer MLr4, and the reference layer RLr4 are formed like the corresponding layers FL, ML, and RL of the MTJ element Rc.

[Method of Manufacturing Magnetoresistive Effect Element]

For example, the MTJ element Rr as described above is manufactured as follows.

In parallel with the MTJ element Rc, for example, a layer equivalent to the shift control layer is formed in the MTJ element Rr as well. After that, a part or the whole of the layer is removed from the MTJ element Rr. The MTJ element Rr3 or Rr4 is thus manufactured.

Note that a method which does not form a layer equivalent to the shift control layer from the first can also be used in the manufacturing process of the MTJ element Rr. This method can be performed by, e.g., masking the MTJ element Rr while the shift control layer SCL is formed in the MTJ element Rc. However, when adopting the method of removing the once formed layer later as described above, it is possible to form a layer equivalent to the shift control layer on the entire surface of, e.g., a substrate to be processed. This facilitates obtaining a magnetic layer (the shift control layer SCL) having higher quality in the MTJ element Rc.

As shown in FIG. 10, magnetization orientations are set in the MTJ elements Rr3 and Rr4 formed as described above. FIG. 10 schematically shows the magnetization switching thresholds of the layers defined by the magnetic field strength in the magnetoresistive effect elements of the magnetic storage device according to the modifications of the present embodiment. (a) of FIG. 10 shows an example of the MTJ element Rc. (b) of FIG. 10 shows an example of the MTJ element Rr3. (c) of FIG. 10 shows an example of the MTJ element Rr4.

As shown in (b) of FIG. 10, the magnetization switching thresholds of the layers FLr3, RLr3, and SCLr3 of the MTJ element Rr3 are respectively proportional to the coercivities of the layers FLr3, RLr3, and SCLr3. The magnetization switching threshold of the reference layer RLr3 is equal to that of, e.g., the reference layer RL of the MTJ element Rc. The magnetization switching threshold of the shift control layer SCLr3 is smaller than that of the reference layer RLr3. The magnetization switching threshold of the free layer FLr3 is equal to that of, e.g., the free layer FL of the MTJ element Rc. The magnetization orientations of all the layers FLr3, RLr3, and SCLr3 are set in the same direction by applying a magnetic field once.

As shown in (c) of FIG. 10, the magnetization switching thresholds of the layers FRr4 and RLr4 of the MTJ element Rr4 are also proportional to the coercivities of the layers FLr4 and RLr4. The magnetization switching thresholds of the layers FLr4 and RLr4 of the MTJ element Rr4 are respectively equal to those of, e.g., the corresponding layers FL and RL of the MTJ element Rc. The magnetization orientations of both the layers FLr4 and RLr4 are set in the same direction by applying a magnetic field once.

The magnetization orientations in the MTJ elements Rc and Rr3 may also be set in parallel. The magnetization orientations in the MTJ elements Rc and Rr4 may also be set in parallel. When setting the magnetization orientations in parallel in any of the MTJ elements Rc, Rr3, and Rr4, the magnetization orientations may also be set at once by applying a magnetic field once for layers equal in magnetization switching threshold and magnetization orientation. That is, the magnetization orientations may also be set in the reference layers RL, RLr3, and RLr4 at once by applying a magnetic field once. Likewise, the magnetization orientations may also be set in the free layers FL, FLr3, and FLr4 at once by applying a magnetic field once.

[Effects of this Modification]

In addition to the effects of the above-described embodiment, this modification produces one or more of effects below.

(A) According to the modification, the shift control layer SCLr3 of the MTJ element Rr3 is thinner than the shift control layer SCL of the MTJ element Rc, more preferably, thinner than the reference layer RLr3 of the MTJ element Rr3.

(B) According to this modification, the thickness of the shift control layer of the MTJ element Rr4 is zero nm.

In configuration (A) or (B) described above, the coercivity of the shift control layer SCLr of the MTJ element Rr is smaller than that of the shift control layer SCL of the MTJ element Rc. More preferably, the coercivity of the shift control layer SCLr is smaller than that of the reference layer RLr3. When the shift control layer SCLr is formed as described above, the magnetization orientation of the free layer FLr is easily maintained parallel to that of the reference layer RLr.

In configuration (A) or (B) described above, the MTJ elements Rc and Rr can be manufactured by substantially the same process.

Second Embodiment

The present embodiment will be described with reference to FIG. 11. FIG. 11 schematically shows circuits on a read path of a magnetic storage device according to the second embodiment.

An MRAM 20 of the present embodiment differs from the above-described embodiment in that a reference cell RC2 has only one MTJ element Rr.

In the reference cell RC2, one MTJ element Rr and one cell transistor CT are coupled in series as shown in FIG. 11. A reference current path RP2 includes the reference cell RC2, and is formed between an input node In2 of a sense amplifier 160sa2 and a ground node VSS of a current sink 130.

The reference cell RC2 has only one P_Stucked MTJ element Rr, and hence has a resistance value which is practically the same as that of the low-resistance MTJ element Rc. Therefore, a reference current flowing through the reference current path RP2 is practically the same as a read current Iread in the low-resistance MTJ element Rc, and hence cannot be the reference for read.

Accordingly, a controller 192 of the present embodiment makes a potential Vclm to be received by the input node In1 as a first input node different from a potential Vref to be received by the input node In2 as a second input node in the sense amplifier 160sa2. That is, the controller 192 clamps the voltage at the other terminal of a transistor QN24 to a particular value by the potential Vref, so that the reference current Iref which is intermediate between the read current Iread in the low-resistance MTJ element Rc and the read current Iread in a high-resistance MTJ element Rc flows through the reference current path RP2.

This allows the sense amplifier 160sa2 to compare the read current Iread with the reference current Iref, and read out data held in a memory cell MC.

The rest of the arrangement of the MRAM 20 is the same as that of the above-described embodiment.

In addition to the effects of the above-described embodiment, the present embodiment produces one or more of effects below.

(A) In the present embodiment, the reference cell RC2 has only one MTJ element Rr.

In the arrangement of (A), the overall configuration of the reference cell RC2 can practically be the same as that of the memory cell MC, and this facilitates designing and manufacturing the MRAM 20.

In the arrangement of (A), it is possible to further save the space of the reference cell RC2.

(B) In the present embodiment, the potential Vclm to be received by the input node In1 differs from the potential Vref to be received by the input node In2.

In the arrangement of (B), the reference current Iref flowing through the reference current path RP2 is so adjusted as to be the reference value of the read current Iread. The reference cell RC2 still has the same temperature characteristic as that of the memory cell MC in the configuration of the present embodiment as well. This eliminates the need to frequently adjust the potential Vref such as when using, e.g., a diffusion resistor different from the MTJ element.

Third Embodiment

Figure 12:
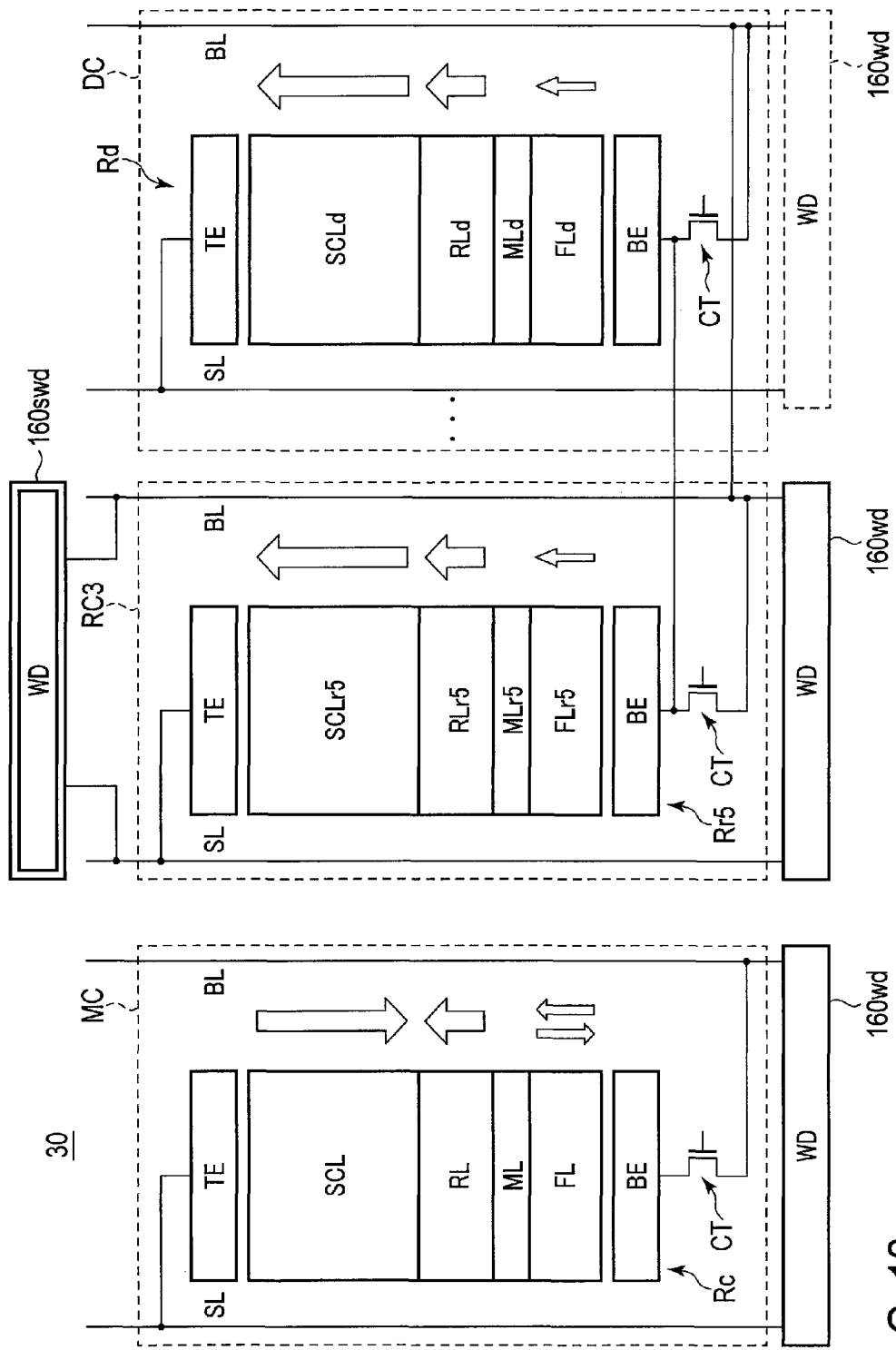
FIG. 12 schematically shows configuration examples of magnetoresistive effect elements of a magnetic storage device according to a third embodiment.
Figure 13:
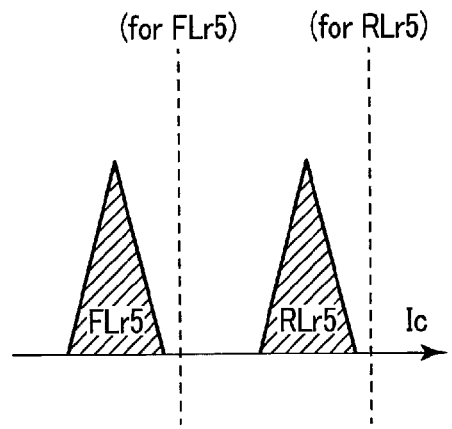
FIG. 13 schematically shows distributions of magnetization switching thresholds in layers of the magnetoresistive effect element of the magnetic storage device according to the third embodiment.

The present embodiment will be described with reference to FIGS. 12 and 13. FIG. 12 schematically shows a configuration example of a magnetoresistive effect element of a magnetic storage device according to the present embodiment. FIG. 13 schematically shows magnetization switching threshold distributions in layers of the magnetoresistive effect element of the magnetic storage device according to the present embodiment.

An MRAM 30 of the present embodiment differs from the above-described embodiment in that an MTJ element Rc used in a memory cell MC and an MTJ element Rr5 used in a reference cell RC3 have practically the same shape.

(1) Configuration Example of Magnetic Storage Device

As shown in FIG. 12, the MRAM 30 includes the memory cell MC, the reference cell RC3, and a dummy cell DC.

The memory cell MC has the same arrangement as that of the above-described embodiment. That is, the memory cell MC includes the MTJ element Rc as one first magnetoresistive effect element, and a cell transistor CT as one first transistor (first cell switch). FIG. 12 shows that one end of each of a bit line BL and source line SL coupled to the memory cell MC is coupled to a write driver 160wd as a first write driver.

The reference cell RC3 includes an MTJ element Rr5 as one second magnetoresistive effect element, and a cell transistor CT as one second transistor. The MTJ element Rr5 includes a free layer FLr5 as a first magnetic layer provided on a bottom electrode BE, a reference layer RLr5 as a second magnetic layer provided on the free layer FLr5, and a shift control layer SCLr5 as a third magnetic layer provided on the reference layer RLr5. A top electrode TE is provided on the shift control layer SCLr5. A middle layer MLr5 is provided between the free layer FLr5 and reference layer RLr5. The magnetization orientations in the storage layer FLr5, RLr5, and SCLr5 are parallel, and the MTJ element Rr5 is a P_Stucked cell fixed to a low resistance.

The MTJ element Rr5 and cell transistor CT are coupled in series with each other. One terminal of the MTJ element Rr5 of the reference cell RC3 is coupled to, e.g., the source line SL. Also, one end of the current path of the cell transistor CT of the reference cell RC3 is coupled to, e.g., the bit line BL. One end of each of the bit line BL and source line SL is coupled to the write driver 160wd. The other end of each of the bit line BL and source line SL is coupled to a write driver 160swd as a second write driver. In addition, the gate of the cell transistor CT of the reference cell RC3 is coupled to a word line WL.

The reference cell RC3 is coupled to, e.g., an input node In2 of a sense amplifier 160sa2 shown in FIG. 11, and so configured as to be able to adjust a potential Vref at the input node In2. Accordingly, the reference cell RC3 is used to generate a reference current to be referred to when reading out data from the memory cell MC. Note that a plurality of reference cells RC3 may also be coupled to one sense amplifier 160sa2. The reference current can be generated by using at least one or more of reference cells RC3.

The dummy cell DC includes one or more sets of one MTJ element Rd and a cell transistor CT as one third transistor. The MTJ element Rd includes a free layer FLd provided on a bottom electrode BE, a reference layer RLd provided on the free layer FLd, and a shift control layer SCLd provided on the reference layer RLd. A top electrode TE is provided on the shift control layer SCLd. A middle layer MLd is provided between the free layer FLd and reference layer RLd. The magnetization orientations in the free layer FLd, reference layer RLd, and shift control layer SCLd are, e.g., the same as those in the corresponding layers of the MTJ element Rr5. However, the magnetization orientations in the layers of the MTJ element Rd are not particularly limited.

The MTJ element Rd and cell transistor CT are coupled in series with each other. One terminal of the MTJ element Rd of the dummy cell DC is not coupled to the source line SL but is, e.g., electrically open. One end of the current path of the cell transistor CT of the dummy cell DC is coupled to, e.g., the bit line BL. One end of each of the bit line BL and source line SL in the dummy cell DC may also be coupled to the write driver 160wd. One end of the current path of the cell transistor CT is also coupled to one end (on the bit line BL side) of the current path of the cell transistor CT of the reference cell RC3. The other end (on the MTJ element Rd side) of the current path of the cell transistor CT is coupled to the other end (on the MTJ element Rr5 side) of the current path of the cell transistor CT of the reference cell RC3. That is, the cell transistor CT of the dummy cell DC is coupled in parallel to the cell transistor CT of the reference cell RC3. In addition, the gate of the cell transistor CT of the dummy cell DC is coupled to a word line WL. The word line WL may also be the same as the word line WL coupled to the cell transistor CT of the reference cell RC3. That is, the cell transistors of the dummy cell DC and reference cell RC3 may also share the word line WL.

The dummy cell DC functions as a simple dummy configuration because one terminal of the MTJ element Rd is electrically open. That is, even when the cell transistor CT of the dummy cell DC is turned on, currents such as a write current and reference current do not flow through the MTJ element Rd, so the MTJ element Rd is not selected.

A second cell switch is mainly formed by the cell transistor CT of the reference cell RC3 and the cell transistor CT of the dummy cell DC. That is, the number of cell transistors CT of the second cell switch is larger than that of the above-mentioned first cell switch.

The MTJ elements Rc, Rr5, and Rd have practically the same shape. "The same shape" means that the outer shapes, the layer configurations, the layer thicknesses, the areas of the layer surfaces, and the like of the MTJ elements Rc, Rr5, and Rd are practically the same. The MTJ elements Rc, Rr5, and Rd are formed by practically the same process, and the MTJ elements Rr5 and Rd have one of a plurality of structures formed as the MTJ element Rc. Accordingly, "the same shape" may include the range of variations in, e.g., the manufacturing process.

The cell transistors CT included in the memory cell MC, reference cell RC, and dummy cell DC also have practically the same configuration and the same performance. Therefore, the current drivabilities of the cell transistors CT are practically equal, and set in accordance with, e.g., the specifications of the memory cell MC. The current drivability of the cell transistor CT refers to the magnitude of a current which the cell transistor CT can pass therethrough. When the current drivability is high, the cell transistor CT can pass a large electric current therethgough. When the current drivability is low, the cell transistor CT can pass only a small electric current therethrough. More specifically, the current drivability of each cell transistor CT is set at, e.g., a value to allow for a supply of a write current which is equal to or larger than the magnetization switching threshold of the free layer FL of the MTJ element Rc and smaller than the magnetization switching threshold of the reference layer RL. Note that the cell transistors CT may include the range of variations in, e.g., the manufacturing process.

The write drivers 160*wd* coupled to the memory cell MC, reference cell RC, and dummy cell DC also have practically the same configuration and the same performance. Therefore, the maximum values of write currents generated by the write drivers 160*wd* are practically equal, and set in accordance with, e.g., the specifications of the memory cell MC. More specifically, the maximum values of the write currents generated by the write drivers 160*wd* are set at a value which is, e.g., equal to or larger than the magnetization switching threshold of the free layer FL of the MTJ element Rc, and smaller than the magnetization switching threshold of the reference layer RL.

The write driver 160*swd* coupled to the reference cell RC has the configuration and performance different from those of the write drivers 160*wd*, and can generate a write current which is, e.g., larger than those generated by the write drivers 160*wd*. More specifically, the maximum value of the write current generated by the write driver 160*swd* is set at a value which is, e.g., equal to or larger than the magnetization switching threshold of the reference layer RLr5 of the MTJ element Rr5. Preferably, the maximum value of the write current generated by the write driver 160*swd* is set at a value which is, e.g., smaller than a current value which causes dielectric breakdown of the MTJ element Rr5.

(2) Method of Manufacturing Magnetoresistive Effect Element

The manufacturing process of the MTJ element Rr5 of the present embodiment is so set that the magnetization orientations in the individual layers of the MTJ element Rr5 are parallel.

For example, in the MTJ element Rr1 shown in FIG. 5 and the MTJ element Rr2 shown in FIG. 6, the coercivities of the shift control layers SCLr1 and SCLr2 are increased. This facilitates making the magnetization orientations of the reference layers RLr1 and RLr2 parallel to those of the shift control layers SCLr1 and SCLr2.

In contrast, the MTJ element Rr5 of the present embodiment has practically the same shape as that of the MTJ element Rc, and the coercivity of the shift control layer sCLr5 is practically equal to that of the shift control layer SCL of the MTJ element Rc. In addition, the configuration of the reference cell RC3 described above makes it impossible to supply, in the reference cell RC3, a write current equal to or larger than the magnetization switching threshold of the reference layer RLr5 of the MTJ element Rr5 by the write driver 160*wd* and cell transistor CT. Therefore, another means for making the magnetization orientation of the reference layer RLr5 parallel to that of the shift control layer SCLr5 is necessary.

As shown in FIG. 13, in the reference cell RC3 of the present embodiment, a write current equal to or larger than a current Ic of the magnetization switching threshold of the reference layer RLr5 is conducted by the write driver 160*swd*, the cell transistor CT of the reference cell RC3, and the cell transistor CT of the dummy cell DC, which is coupled in parallel to the cell transistor CT of the reference cell RC3.

That is, when setting the magnetization orientation of the reference layer RLr5, the write driver 160*swd* generates a write current equal to or larger than the magnetization switching threshold of the reference layer RLr5.

In contrast, the word line WL coupled to the cell transistor CT of the reference cell RC3 and one or more cell transistors CT of the dummy cell DC is made high, so those cell transistors CT are turned on. The cell transistors CT are coupled in parallel to each other, and the overall current drivability of the cell transistors CT can be increased by driving the cell transistors CT together. That is, the current drivability of the second cell switch is higher than that of the first cell switch. As the number of cell transistors CT of the dummy cell DC increases, the current drivability of the second cell switch increases, and the ease with which the performance variations between the cell transistors CT in the second cell switch are canceled increases.

As described above, the write driver 160*swd* and the plurality of cell transistors CT supply, to the MTJ element Rr5, the write current equal to or larger than the magnetization switching threshold of the reference layer RLr5. The direction in which this write current flows is set such that the magnetization orientation of the reference layer RLr5 is parallel to that of the shift control layer SCLr5. Accordingly, the write current flows from the bit line BL to the source line SL, or vice versa.

In contrast, one terminal of the MTJ element Rd of the dummy cell DC is, e.g., electrically open, so no write current flows to the MTJ element Rd.

Note that as described above, it is possible to eliminate the concern of breakdown voltage of the MTJ element Rr5 applied when a large current is supplied, by associating a plurality of reference cells RC to one sense amplifier 160*sa*2. Even if insulation breakdown occurs in several MTJ elements Rr5, the reference current can be generated by using other MTJ elements Rr5 in actual read.

From the foregoing, the magnetization orientation of the reference layer RLr5 is made parallel to that of the shift control layer SCLr5. Also, the magnetization orientation of the free layer FLr5 is made parallel (P_Stucked) to that of the shift control layer SCLr5.

Note that like the reference cell RC shown in FIG. 1 described earlier, the reference cell RC3 may also include a plurality of MTJ elements Rr5 coupled in series or parallel, and one cell transistor CT coupled in series with the plurality of MTJ elements Rr5. The reference cell RC3 thus configured is coupled to, e.g., the input node Int of the sense amplifier 160*sa* shown in FIG. 8, and the potential Vref at the input node Int is so adjusted as to be equal to the potential Vclm at the input node In1.

In the above-mentioned configuration example of the MRAM 30, the reference cell RC3 is coupled to the write driver 160*swd*, and the MTJ element Rr5 of the reference cell RC3 is coupled in series with the plurality of cell transistors CT. However, the configuration of the MRAM 30 is not limited to this.

For example, the write driver 160*wd* coupled to each of the cells MC and RC3 may also be configured to generate a larger electric current. The write driver 160*wd* like this can be used not only when writing data in the MTJ element Rc, but also when switching the magnetization orientation of the reference layer RLr5 of the MTJ element Rr5. In this case, the write driver 160*sed* is unnecessary.

Alternatively, a single cell transistor CT in each of the cells MC and RC3 may also be configured to have a higher current drivability. The cell transistor CT like this can supply a sufficient write current not only when writing data in the MTJ element Rc, but also when reversing the magnetization orientation of the reference layer RLr5 of the MTJ element Rr5. In this case, the dummy cell DC is unnecessary.

(3) Effects of this Embodiment

In addition to the effects of the above-described embodiments, the present embodiment achieves one or more of effects below.

(A) In the present embodiment, the MRAM 30 includes the MTJ element Rc, and the MTJ element Rr5 having the same shape as that of the MTJ element Rc.

This facilitates designing the MTJ elements Rc and Rr5, e.g., makes it possible to form these MTJ elements at once by the same process.

(B) In the present embodiment, the write driver 160swd coupled to the MTJ element Rr5 generates a current larger than that generated by the write driver 160wd coupled to the MTJ element Rc.

In the configuration (B), even when the MTJ elements Rr5 and Rc have practically the same shape, the magnetization orientation of the reference layer RLr5 can be switched. Accordingly, the MTJ element Rr5 can be configured as a P_Stuck cell.

In the configuration (B), the write driver 160wd can be used when writing data in the MTJ element Rc. This makes it possible to prevent the write driver 160wd from being unnecessarily enlarged, thereby preventing an increase in power consumption.

(C) In the present embodiment, the plurality of cell transistors CT coupled in series with the MTJ element Rr5 have the current drivability higher than that of the cell transistor CT coupled in series with the MTJ element Rc.

Consequently, even when the MTJ elements Rr5 and Rc have practically the same shape, the magnetization orientation of the reference layer RLr5 can be switched.

In the MRAM 30, the overall current drivability is raised by increasing the number of cell transistors CT coupled to the MTJ element Rr5. Therefore, the cell transistors CT of the reference cell RC3 and memory cell MC can have practically the same configuration.

In the configurations (A) and (C), the memory cell MC and reference cell RC3 have practically the same configuration. This facilitates designing and manufacturing the memory cell MC and reference cell RC3 as a whole. In the MRAM 30, the MTJ element Rd also has the same shape as that of the MTJ elements Rc and Rr5. The MTJ element Rd is functionally not essential; however, incorporation of the MTJ element Rd results in the dummy cell DC also having practically the same configuration as that of the memory cell MC and reference cell RC3. This further facilitates designing and manufacturing the whole configuration including the dummy cell DC.

Figure 14:
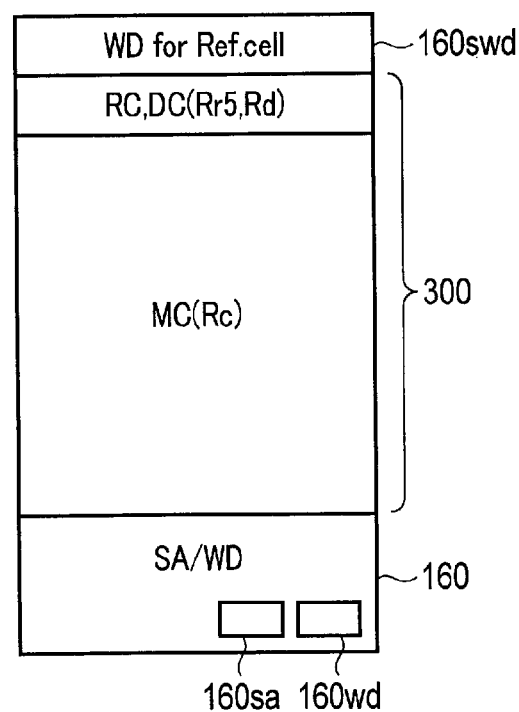
FIG. 14 shows an example of the layout of a memory cell array of the magnetic storage device according to the third embodiment.

Since the memory cell MC, reference cell RC3, and dummy cell DC have practically the same configuration, the cells MC, RC3, and DC can easily be arranged in the memory cell array 300 as shown in, e.g., FIG. 14. FIG. 14 shows an example in which the reference cell RC3 and dummy cell DC are arranged near the edge in the memory cell array 300. The write driver 160swd is arranged, e.g., near the reference cell RC3 and outside the memory cell array 300. Alternatively, the cells MC, RC3, and DC may also coexist in the memory cell array 300. Thus, the region where the reference cell RC3 is arranged need not be secured outside the memory cell array 300, so the area occupied by the reference cell RC3 in the MRAM 30 can be reduced.

Fourth Embodiment

Figure 15:
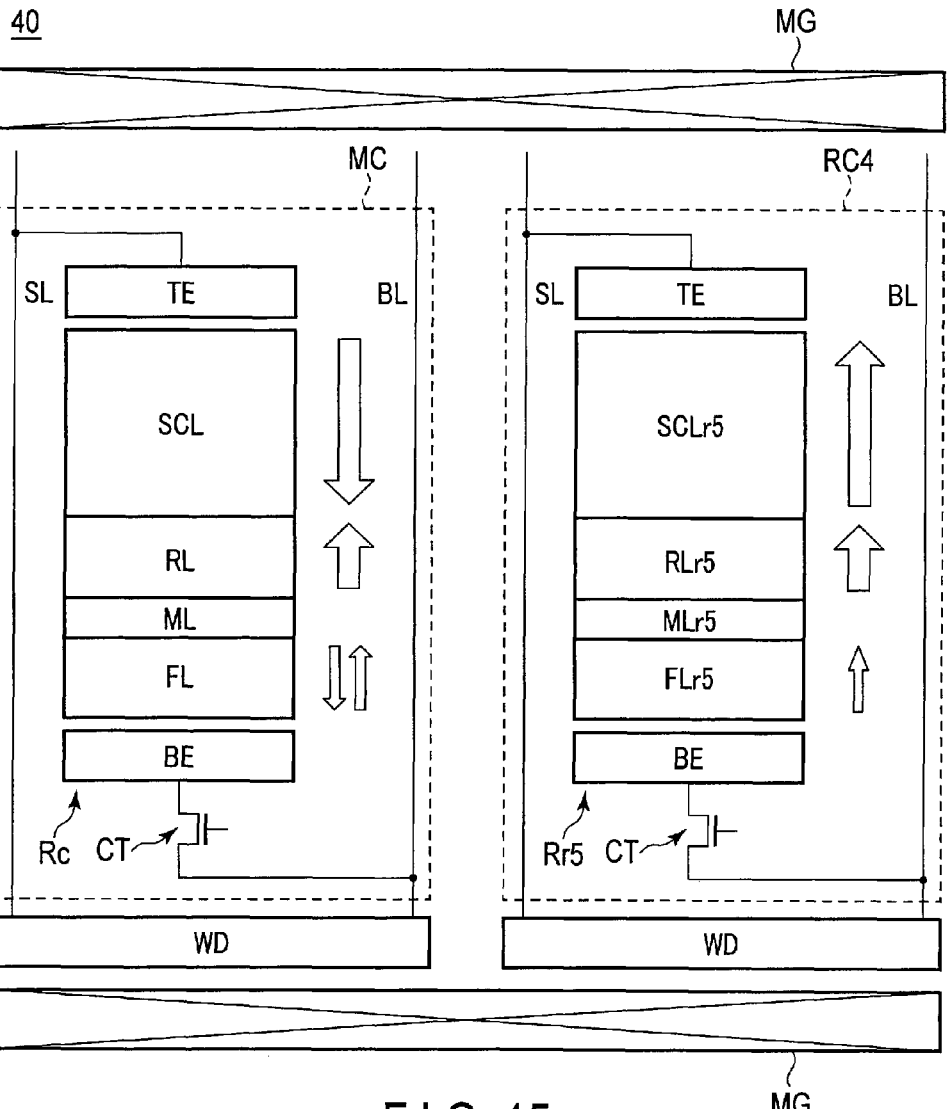
FIG. 15 schematically shows configuration examples of magnetoresistive effect elements of a magnetic storage device according to a fourth embodiment.
Figure 16:
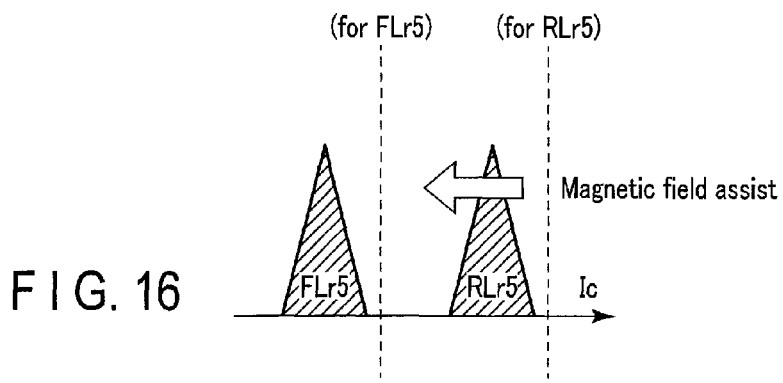
FIG. 16 schematically shows distributions of magnetization switching thresholds in layers of the magnetoresistive effect element of the magnetic storage device according to the fourth embodiment.

The present embodiment will be described with reference to FIGS. 15 and 16. FIG. 15 schematically shows a configuration example of a magnetoresistive effect element of a magnetic storage device according to the present embodiment. FIG. 16 schematically shows magnetization switching threshold distributions in layers of the magnetoresistive effect element of the magnetic storage device according to the present embodiment.

An MRAM 40 of the present embodiment differs from the above-described embodiment in that the MRAM 40 does not include the write driver 160swd and dummy cell DC shown in FIG. 12 described above.

(1) Configuration Example of Magnetic Storage Device

As shown in FIG. 15, the MRAM 40 includes a memory cell MC and reference cell RC4.

The memory cell MC has the same configuration as that of the above-described embodiment.

The reference cell RC4 differs from the reference cell RC3 shown in FIG. 12 described above in that not a plurality of cell transistors CT but one cell transistor CT is coupled in series with an MTJ element Rr5. That is, the cell switch of the MTJ element Rr5 includes only one cell transistor CT. In addition, the reference cell RC4 differs from the reference cell RC3 shown in FIG. 12 described above in that the write driver 160swd is not coupled. The rest of the configuration of the reference cell RC4 is the same as that of the reference cell RC3.

The reference cell RC4 is coupled to, e.g., an input node In2 of a sense amplifier 160sa2 shown in FIG. 11, and used to generate a reference current to be referred to when reading out data from the memory cell MC.

An MTJ element Rc and the MTJ element Rr5 have practically the same shape as in the above-described embodiment.

Cell transistors CT included in the memory cell MC and reference cell RC4 also have current drivability set in accordance with, e.g., the specifications of the memory cell MC, as in the above-described embodiment. That is, the cell transistors CT cannot supply a write current equal to or larger than the magnetization switching threshold of a reference layer RLr5.

Write drivers 160wd coupled to the memory cell MC and reference cell RC4 also have current generation capability set in accordance with, e.g., the specifications of the memory cell MC, as in the above-described embodiment. That is, the write drivers 160wd cannot generate a write current equal to or larger than the magnetization switching threshold of the reference layer RLr5.

(2) Method of Manufacturing Magnetoresistive Effect Element

In the manufacturing process of the MTJ element Rr5 of the present embodiment, the magnetization orientations in individual layers of the MTJ element Rr5 are set parallel to each other.

In the reference cell. RC4, however, the write driver 160wd and cell transistor CT cannot switch the magnetization orientation of the reference layer RLr5. Accordingly, another means for making the magnetization orientation of the reference layer RLr5 parallel to that of a shift control layer SCLr5 is necessary.

When setting the magnetization orientations of the individual layers in the reference cell RC4 of the present embodiment as shown in FIG. 15, magnets MG are arranged at the top electrode TE side and bottom electrode BE side of the reference cell RC4, so as to sandwich the reference cell RC4 (or the whole MRAM 40). The magnets MG can be either electromagnets or permanent magnets. In this state, the write driver 160wd and cell transistor CT supply a write current to the MTJ element Rr5.

In the reference cell RC4 of the present embodiment as shown in FIG. 16, therefore, a magnetic field assisting effect is added to the write driver 160wd and cell transistor CT. Accordingly, the magnetization orientation of the reference layer RLr5 can be switched by a write current smaller than a current Ic of the magnetization switching threshold of the reference layer RLr5. In other words, it is possible to decrease the electric current Ic of the apparent magnetization switching threshold of the reference layer RLr5.

In this state, the MTJ element Rc arranged in the MRAM 40 is also placed under the influence of the magnetic field, like the MTJ element Rr5. However, the MTJ element Rc is not rewritten unless the write current flows to the MTJ element Rc.

Consequently, the magnetization orientation of the reference layer RLr5 is made parallel to that of the shift control layer SCLr5. The magnetization orientation of a free layer FLr5 is also made parallel (P_Stucked) to those of the reference layer RLr5 and shift control layer SCLr5.

Note that the reference cell RC4 may also include a plurality of MTJ elements Rr5 coupled in series or parallel, and one cell transistor CT coupled in series with the MTJ elements Rr5, as in the reference cell CT shown in FIG. 1 described earlier. The reference cell RC4 having this configuration is coupled to, e.g., the input node In2 of the sense amplifier 160sa shown in FIG. 8, and used to generate a reference current to be referred to when reading out data from the memory cell MC.

This configuration of the MRAM 40 using the magnetic field assist is also applicable to the configuration of the MRAM 30. In this case, the magnetic field assisting effect is added to the write driver swd and the plurality of cell transistors CT. This makes it possible to compensate for a shortage of the write current supplied by the write driver swd and the plurality of cell transistors CT.

(3) Effects of this Embodiment

In addition to the effects of the above-described embodiments, the present embodiment produces one or a plurality of effects below.

(A) In the present embodiment, the maximum value of the write current supplied by the write driver wd and cell transistor CT is smaller than the magnetization switching threshold of the reference layer RLr5 of the MTJ element Rr5. This makes it possible to prevent a large electric current from flowing to the MTJ element Rr5, and reduce insulation breakdown of the MTJ element Rr5.

(B) In the present embodiment, when switching the magnetization orientation of the reference layer RLr5 of the MTJ element Rr5, the write driver 160wd and cell transistor CT supply the write current to the MTJ element Rr5 while a magnetic field is applied. Accordingly, the magnetization orientation of the reference layer RLr5 can be switched without supplying a large electric current to the MTJ element Rr5.

Fifth Embodiment

The present embodiment will be described with reference to FIGS. 17 and 18. An MRAM 50 of the present embodiment differs from the above-described embodiment in that a reference cell RC3 is not directly coupled to a reference current path RP5.

FIG. 17 schematically shows circuits on a read path of the magnetic storage device according to the present embodiment.

As shown in FIG. 17, the MRAM 50 includes a transistor QN50, sense amplifier replicas 160sar1 and 160sar2, a constant voltage generator 51, a current mirror circuit 52, and a reference circuit 53. The transistor QN50 is provided on the reference current path RP5 of, e.g., each sense amplifier 160sa (or a sense amplifier 160sa2 shown in FIG. 11). The constant voltage generator 51 is provided on a replica current path ReP1 between the sense amplifier replica 160sar1 and a ground node VSS. The reference circuit 53 is provided on a replica current path ReP2 between the sense amplifier replica 160sar2 and ground node VSS. The current mirror circuit 52 is provided on both the replica current paths ReP1 and ReP2.

More specifically, the transistor QN50 is coupled in series between a bit line BL and source Line SL on the reference current path RP5. The gate of the transistor QN50 is coupled to the constant voltage generator 51, and receives a potential Vbias. The potential Vbias is so adjusted that a reference current Tref having a desired magnitude flows on the reference current path RP5.

The sense amplifier replica 160sar1 includes transistors QP51, QP52, and QN52. The transistors QP51 and QN52 are coupled in series between a power node VDD2A and input node Inr. The gate of the transistor QP51 is coupled to the gate of the transistor QN52. The gates of the transistors QP51 and QN52 are further coupled to the power node VDD2A. The transistor QP52 is coupled between the power node VDD2A and input node Inr. The gate of the transistor QP51 is coupled to the power node VDD2A.

The sense amplifier replica 160sar2 also includes transistors QP51, QP52, and QN52. That is, the sense amplifier replica 160sar2 has the same configuration as that of the sense amplifier replica 160sar1.

The current mirror circuit 52 includes transistors QN53 and QN54, and copies, e.g., the output from the transistor QN54 to the transistor QN53 in the ratio of one to one.

One terminal of the transistor QN53 is coupled to the input node Inr of the sense amplifier replica 160sar1. The other terminal of the transistor QN53 is coupled to the constant voltage generator 51. One terminal of the transistor QN54 is coupled to the input node Inr of the sense amplifier replica 160sar2. The other terminal of the transistor QN54 is coupled to the reference circuit 53. The gate of the transistor QN54 is coupled to one terminal thereof on the sense amplifier replica 160sar2 side.

The gates of the transistors QN53 and QN54 are also coupled to the gate of a transistor QN24 coupled to the sense amplifier 160sa. A controller 190 (or a controller 192 shown in FIG. 11) causes a current generator (not shown) or the like to supply a potential Vref to the gates of the transistors QN24, QN53, and QN54.

The constant voltage generator 51 includes a transistor QN51. The transistor QN51 is provided between the sense amplifier replica 160sar1 and ground node VSS. The gate of the transistor QN51 is coupled to one terminal thereof on the sense amplifier replica 160sar1 side, and the gate of the transistor QN50.

The reference circuit 53 includes a configuration which generates a reference current, and is coupled to a plurality of sense amplifiers 160sa via the current mirror circuit 52, constant voltage generator 51, and transistor QN50.

As the configuration for generating a reference current, FIG. 17 includes the reference cell RC3, dummy cell DC, and write driver 160swd (not shown) shown in FIG. 12 described previously. However, this configuration is an example, is not the only example. The reference circuit 53 may also include the reference cell RC shown in FIG. 1, or the reference cell RC4 shown in FIG. 15. The reference cells RC and RC4 may include any of the MTJ elements Rr1 to Rr5 shown in FIGS. 5, 6, 9, 12, and 15 described above.

Similarly, the detailed configuration of the constant voltage generator 51 and current mirror circuit 52 shown in FIG. 17 are merely examples.

When reading out data in the above configuration, a current flowing on the reference current path RP5 can be used as the reference current Iref.

The reference circuit 53 causes the reference cell RC3 or the like to generate a current equal to the reference current Iref, or a current convertible into the reference current Iref. This current is output, e.g., in the ratio of one to one to the constant voltage generator 51 via the current mirror circuit 52. Based on the current from the current mirror circuit 52, the constant voltage generator 51 applies the potential Vbias to the gate of the transistor QN50. The transistor QN50 supplies the reference current Iref having a magnitude corresponding to the potential Vbias onto the reference current path RP5. Thus, the transistor QN50 functions as a resistance element which adjusts the magnitude of the reference current Iref flowing on the reference current path RP5.

Figure 18:
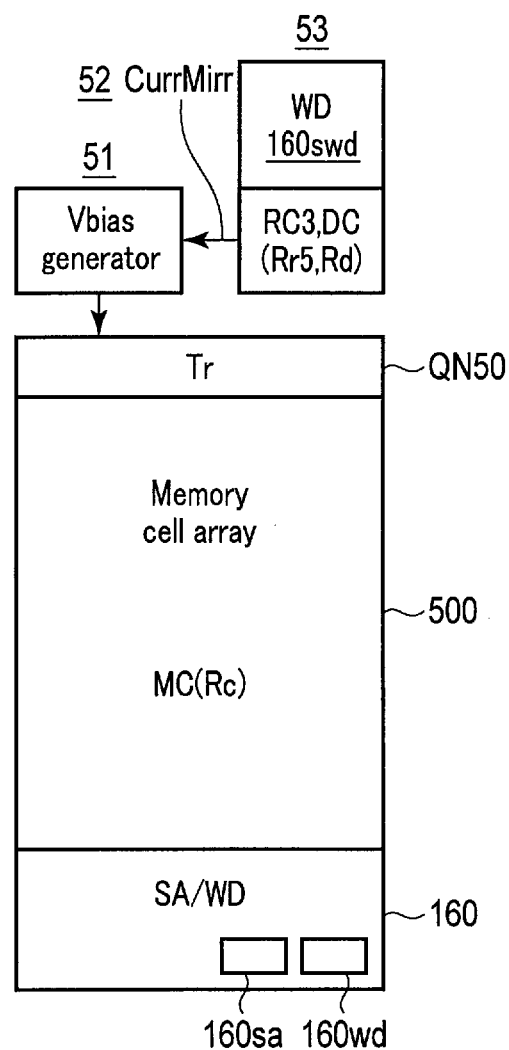
FIG. 18 shows an example of the layout of a memory cell array of the magnetic storage device according to the fifth embodiment.

FIG. 18 shows an example of the layout of a memory cell array of the magnetic storage device according to the present embodiment.

As shown in FIG. 18, the constant voltage generator 51, current mirror circuit 52, and reference circuit 53 are arranged, e.g., outside a memory cell array 500. The transistor QN50 is arranged, e.g., on the edge of the memory cell array 500.

This embodiment produces the following effect in addition to the effects of the above-described embodiments.

In the present embodiment, the reference circuit 53 is coupled to the input nodes In2 of the plurality of sense amplifiers 160sa. Since the reference circuit 53 is shared by the plurality of sense amplifiers 160sa, the reference circuit 53 need not be provided for each sense amplifier 160sa. This reduces the area occupied by the reference circuit 53 in the MRAM 50.

Other Embodiments

In the above-described embodiments and modifications, the magnetization orientations in the individual layers of the MTJ elements Rc and Rr are as shown in FIGS. 2, 5, 6, 9, 12, and 15, but the magnetization orientations in these layers are relative. If the relative relationship (parallel or antiparallel) between the magnetization orientations in the layers remains the same, whether the magnetization orientation of each layer points to the top electrode TE or bottom electrode BE does not matter. For example, in the MTJ element Rc shown in FIG. 2, the magnetization orientation of the shift control layer may also point to the top electrode, and that in the reference layer may also point to the bottom electrode. Alternatively, in the MTJ element Rr shown in FIG. 5, the magnetization orientations in all the layers may also point to the bottom electrode.

In the above-described embodiments and modifications, the description has been given of the reduction of the area of the layer surface of the shift control layer SCLr in the MTJ element Rr as an example of the configuration for increasing the coercivity of the shift control layer SCLr. However, this is not the only example. In a perpendicular magnetization MTJ element such as the MTJ element Rr, the coercivity often increases when the thickness of a magnetic layer such as the shift control layer SCLr is increased or the area of the layer surface is reduced. However, if the coercivity increases when the area of the layer surface is increased in a perpendicular magnetization MTJ element, an MTJ element in which the area of the layer surface of a shift control layer is increased is applicable to a reference cell.

In the above-described embodiments and modifications, the description has been given on the examples of the MTJ elements Rc and Rr are perpendicular magnetization MTJ elements. However, this is not the only example. These MTJ elements may also be a horizontal MTJ elements having horizontal magnetic anisotropy. In this case, each layer of the MTJ element has a magnetization orientation of a direction along the layer surface. "The direction along the layer surface" is a direction which is horizontal or nearly horizontal to the layer surface. In the horizontal magnetization MTJ element, the coercivity generally increases when the thickness of a magnetic layer is reduced or the area of the layer surface is increased. When the MTJ element is the horizontal magnetization MTJ element, therefore, the coercivity of a shift control layer may also be increased by reducing the thickness of the shift control layer or increasing the area of the layer surface of the shift control layer. To decrease the coercivity of the shift control layer, it is possible to apply an arrangement opposite to these arrangements.

In the above-described embodiments and modifications, the description has been given of the example in which the MTJ elements Rc and Rr are bottom-free (top-pin) MTJ elements in which the free layers FL and FLr are arranged below the reference layers RF and RLr. However, this is not the only example. These MTJ elements may also be top-free (bottom-pin) MTJ elements in which free layers are arranged above reference layers. It is also possible to arrange a shift control layer on the free layer side, e.g., between a free layer and electrode.

In the above-described embodiments and modifications, the description has been given of the example in which the MTJ elements Rc and Rr include the free layers FL and FLr, middle layers ML and MLr, reference layers RL and RLr, and shift control layers SCL and SCLr. However, this is not the only example. These MTJ elements may also include layers other than the above-described layers. For example, these MTJ elements may also include a spacer layer between the reference layer and shift control layer. The spacer layer has a function of suppressing a ferromagnetic coupling between the reference layer and shift control layer.

In the above-described embodiments and modifications, the description has been given of the example in which the reference cell RC is arranged outside the memory cell arrays 100 and 500. However, this is not the only example. The reference cell may also be arranged in the memory cell array. The memory cell and reference cell need not share the word line. On the contrary, the memory cell and reference cell having no correspondence may also share the bit line and source line. The interconnection structure between the memory cell and reference cell, the positional relationship between the memory cell and reference cell, and the like can be selected from various structures, various positional relationships, and the like other than those described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the invention.

What is claimed is:

1. A magnetic storage device comprising:
a first magnetoresistive effect element comprising a first magnetic layer having a first coercivity, a second magnetic layer having a second coercivity higher than the first coercivity, and a third magnetic layer having a third coercivity higher than the second coercivity, a magnetization orientation of the second magnetic layer being antiparallel to a magnetization orientation of the third magnetic layer;
a second magnetoresistive effect element comprising a fourth magnetic layer having a fourth coercivity, a fifth magnetic layer having a fifth coercivity higher than the fourth coercivity, and a sixth magnetic layer having a sixth coercivity higher than the fifth coercivity, a magnetization orientation of the fifth magnetic layer being parallel to a magnetization orientation of the sixth magnetic layer; and
an amplifier having a first input coupled to the first magnetoresistive effect element and a second input coupled to the second magnetoresistive effect element, and amplifying a difference between a potential of the first input and a potential of the second input.

2. The device of claim 1, wherein
a current required to make a magnetization orientation of the fourth magnetic layer parallel to the magnetization orientation of the fifth magnetic layer is larger than a current required to make the magnetization orientation of the fourth magnetic layer antiparallel to the magnetization orientation of the fifth magnetic layer.

3. The device of claim 1, wherein
a value of the first coercivity of the first magnetic layer having a magnetization orientation parallel to the magnetization orientation of the second magnetic layer is larger than a value of the first coercivity of the first magnetic layer having the magnetization orientation antiparallel to the magnetization orientation of the second magnetic layer.

4. The device of claim 1, wherein
the sixth coercivity is larger than the third coercivity.

5. The device of claim 1, wherein
the third magnetic layer has a first area along an interface with the second magnetic layer,
the sixth magnetic layer has a second area along an interface with the fifth magnetic layer,
the sixth magnetic layer has substantially the same thickness as a thickness of the third magnetic layer, and
the second area is smaller than the first area.

6. The device of claim 1, wherein
the third magnetic layer has a first area along an interface with the second magnetic layer,
the sixth magnetic layer has a second area along an interface with the fifth magnetic layer,
the sixth magnetic layer is thicker than the third magnetic layer, and
the second area is substantially the same as the first area.

7. The device of claim 1, wherein
the fourth magnetic layer comprises substantially the same material as the first magnetic layer,
the fifth magnetic layer comprises substantially the same material as the second magnetic layer, and
the sixth magnetic layer comprises substantially the same material as the third magnetic layer.

8. The device of claim 1, wherein
the second magnetoresistive effect element further comprises a first electrode coupled to a first interconnect, and a second electrode coupled to a second interconnect,
the device further comprises at least one of a first magnet and a second magnet,
the first magnet and the second electrode sandwich the first electrode, and
the second magnet and the first electrode sandwich the second electrode.

9. A magnetic storage device comprising:
a first magnetoresistive effect element comprising a first magnetic layer and a second magnetic layer which sandwich a first nonmagnetic layer, and a third magnetic layer which sandwiches the second magnetic layer with the first nonmagnetic layer, a magnetization orientation of the second magnetic layer being antiparallel to a magnetization orientation of the third magnetic layer;
a second magnetoresistive effect element comprising a fourth magnetic layer and a fifth magnetic layer which sandwich a second nonmagnetic layer, and a sixth magnetic layer which sandwiches the fifth magnetic layer with the second nonmagnetic layer, the sixth magnetic layer having a shape different from a shape of the third magnetic layer, and a magnetization orientation of the fifth magnetic layer being parallel to a magnetization orientation of the sixth magnetic layer; and
an amplifier having a first input coupled to the first magnetoresistive effect element and a second input coupled to the second magnetoresistive effect element, and amplifying a difference between a potential of the first input and a potential of the second input.

10. The device of claim 9, wherein
the third magnetic layer has a first area along an interface with the second magnetic layer,
the sixth magnetic layer has a second area along an interface with the fifth magnetic layer,
the sixth magnetic layer has substantially the same thickness as a thickness of the third magnetic layer, and
the second area is smaller than the first area.

11. The device of claim 9, wherein
the third magnetic layer has a first area along an interface with the second magnetic layer,
the sixth magnetic layer has a second area along an interface with the fifth magnetic layer,
the sixth magnetic layer is thicker than the third magnetic layer, and
the second area is substantially the same as the first area.

12. The device of claim 9, wherein
the third magnetic layer has a first area along an interface with the second magnetic layer,
the sixth magnetic layer has a second area along an interface with the fifth magnetic layer,
the sixth magnetic layer is thinner than the third magnetic layer, and
the second area is substantially the same as the first area.

13. The device of claim 9, wherein
the fourth magnetic layer comprises substantially the same material as the first magnetic layer,
the fifth magnetic layer comprises substantially the same material as the second magnetic layer, and
the sixth magnetic layer comprises substantially the same material as the third magnetic layer.

14. The device of claim 9, wherein
the third magnetic layer has a coercivity larger than a coercivity of the second magnetic layer, and
the sixth magnetic layer has a coercivity smaller than a coercivity of the fifth magnetic layer.

15. The device of claim 9, wherein
a coercivity of the sixth magnetic layer is smaller than a coercivity of the third magnetic layer.

16. A magnetic storage device comprising:
a first magnetoresistive effect element;
a reference circuit comprising a second magnetoresistive effect element;
an amplifier having a first input coupled to the first magnetoresistive element and a second input coupled to the reference circuit, and amplifying a difference between a potential of the first input and a potential of the second input;
a first circuit which conducts a first write current through the first magnetoresistive effect element; and
a second circuit which conducts a second write current larger than the first write current through the second magnetoresistive effect element.

17. The device of claim 16, wherein
the first circuit comprises a first driver and a first switch between the first magnetoresistive effect element and the first driver,
the second circuit comprises a second driver and a second switch between the second magnetoresistive effect element and the second driver,
the second driver outputs a current larger than the maximum current output by the first driver, or the second switch allows a first current to flow through the second switch,
the first current is larger than a current which the first switch allows to flow through the first switch.

18. The device of claim 17, wherein
the second switch comprises two or more transistors coupled in parallel.

19. The device of claim 18, wherein
the reference circuit comprises:
 a current mirror circuit which outputs a current which flows through the reference circuit;
 a voltage generator which generates a potential based on the current output from the current mirror circuit; and
 a transistor coupled to the second input of the sense amplifier and having a gate which receives the potential.

20. The device of claim 19, further comprising
second amplifiers each comprising a first input coupled to the reference circuit.

* * * * *